US009963775B2

(12) United States Patent
Le Flem et al.

(10) Patent No.: US 9,963,775 B2
(45) Date of Patent: May 8, 2018

(54) MULTILAYER MATERIAL RESISTANT TO OXIDATION IN A NUCLEAR ENVIRONMENT

(71) Applicant: COMMISSARIAT A L'ENERGIE ATOMIQUE ET AUX ENERGIES ALTERNATIVES, Paris (FR)

(72) Inventors: Marion Le Flem, Fontenay Aux Roses (FR); Cédric Ducros, Bevenais (FR); Frédéric Sanchette, Montferrat (FR)

(73) Assignee: COMMISARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 635 days.

(21) Appl. No.: 14/524,174

(22) Filed: Oct. 27, 2014

(65) Prior Publication Data
US 2015/0050521 A1 Feb. 19, 2015

Related U.S. Application Data

(63) Continuation of application No. PCT/FR2013/050849, filed on Apr. 17, 2013.

(30) Foreign Application Priority Data

Apr. 26, 2012 (FR) ...................................... 12 53887

(51) Int. Cl.
*B32B 15/00* (2006.01)
*C23C 14/16* (2006.01)
(Continued)

(52) U.S. Cl.
CPC ............ *C23C 14/165* (2013.01); *B32B 15/01* (2013.01); *C23C 14/34* (2013.01); *C23C 14/35* (2013.01);
(Continued)

(58) Field of Classification Search
None
See application file for complete search history.

(56) References Cited

U.S. PATENT DOCUMENTS

| 4,029,545 A | 6/1977 | Gordon et al. |
| 4,268,586 A | 5/1981 | Hanneman et al. |
| 5,460,663 A | 10/1995 | Hashimoto et al. |

FOREIGN PATENT DOCUMENTS

| EP | 0240110 A1 | 10/1987 |
| FR | 1493040 A | 8/1967 |
| FR | 2849620 A1 | 7/2004 |
| GB | 1203700 A | 9/1970 |
| JP | H05171418 A1 | 7/1993 |
| JP | 2006-219740 | 8/2006 |

OTHER PUBLICATIONS

Brachet, et al., Nuclear Fuel Claddings, Production Method Thereof and Uses of Same Against Oxidation/Hydriding, U.S. Appl. No. 15/462,176, filed Mar. 17, 2017 (not yet published).
(Continued)

*Primary Examiner* — Daniel J Schleis
(74) *Attorney, Agent, or Firm* — Browdy And Neimark, P.L.L.C.

(57) ABSTRACT

Multilayer material comprising a zirconium-based substrate covered with a multilayer coating, the multilayer coating comprising metallic layers composed of identical or different substances chosen from chromium, a chromium alloy or a ternary alloy of the Nb—Cr—Ti system. Such a material has improved resistance to oxidation in accident conditions of a nuclear reactor. The invention also relates to a multilayer coating, a part composed wholly or partly of the multilayer material or of the multilayer coating, as well as the method for manufacturing the multilayer material such as for example a magnetron cathodic sputtering process.

31 Claims, 13 Drawing Sheets

(51) Int. Cl.
  *B32B 15/01*  (2006.01)
  *C23C 28/02*  (2006.01)
  *G21C 3/07*  (2006.01)
  *G21C 3/20*  (2006.01)
  *C23C 14/34*  (2006.01)
  *C23C 14/35*  (2006.01)
  *C23C 16/06*  (2006.01)

(52) U.S. Cl.
  CPC .............. *C23C 16/06* (2013.01); *C23C 28/02* (2013.01); *C23C 28/021* (2013.01); *C23C 28/023* (2013.01); *G21C 3/07* (2013.01); *G21C 3/20* (2013.01); *Y02E 30/40* (2013.01); *Y10T 428/12806* (2015.01); *Y10T 428/12819* (2015.01); *Y10T 428/12847* (2015.01)

(56) References Cited

OTHER PUBLICATIONS

Jun Hwan Kim et al. "Performance of a diffusion barrier under a fuel-clad chemical interaction (FCCI)" Journal of Nuclear Materials, pp. 144-150, vol. 394 (Aug. 2009).
Database WPI, XP-002690390, Korea Atomic Energy Res Inst, (Oct. 2010).
D.L. Davidson et al. "The Effects on Fracture Toughness of Ductile-Phase Composition and Morphology in Nb—Cr—Ti and Nb—Si in Situ Composites", Metallurgical and Materials Transactions A, pp. 3007-3018, vol. 27A, (Oct. 1996).
Database WPI, XP-002690463, Mok Y Ket al. (Mar. 2006).
Translated Notice of Reasons for Refusal dated Dec. 5, 2017 for JP patent application No. 2015-507576.

MULTILAYER MATERIAL RESISTANT TO OXIDATION IN A NUCLEAR ENVIRONMENT

TECHNICAL FIELD

The present invention relates to the field of materials employed in the nuclear field, in particular materials intended to have a resistance to the physicochemical conditions encountered during a nuclear reactor accident which is as good as possible.

The invention relates more particularly to such a material, its coating, a part comprising the material or the coating, uses thereof, as well as the method for manufacturing the material.

TECHNICAL BACKGROUND

In service conditions, the coolant of a pressurized water reactor ("PWR") is water that is pressurized to 190 bar and reaches a maximum temperature of 360° C.

In such conditions, the zirconium alloy constituting the nuclear fuel claddings oxidizes in contact with the coolant.

As the oxide formed is brittle, the service life of the claddings is partly limited by the acceptable maximum thickness of oxide. Beyond that, the residual thickness of zirconium alloy that is sound and ductile is insufficient to guarantee good mechanical properties with the aim of ensuring optimal confinement of the nuclear fuel.

Limiting the oxidation in nominal conditions would therefore make it possible to increase the service life of the claddings and therefore improve the burn-up fraction of uranium dioxide.

For this purpose, fuel suppliers have developed new alloys that are more resistant to corrosion in nominal conditions, such as the alloy M5™ from the company Areva-NP.

Although these developments have made it possible to improve the resistance of zirconium alloy claddings to the low-temperature oxidation encountered in nominal conditions, they do not provide decisive gains in the resistance to high-temperature oxidation encountered in accident conditions.

The high temperatures are generally above 700° C., in particular between 800° C. and 1200° C. They are for example reached in the case of hypothetical accident scenarios of the RIA type (Reactivity Insertion Accident) or LOCA type (Loss Of Coolant Accident), or even in conditions of dewatering of the spent fuel storage pool. At such temperatures, the coolant is in the form of steam.

As detailed below, high-temperature oxidation is much more critical than low-temperature oxidation, as deterioration of the cladding, the first barrier for fuel confinement, is quicker and the associated risks are greater. These risks are, among others, as follows:
  release of hydrogen;
  embrittlement of the cladding at high temperature, by oxidation or even, in certain conditions, hydriding of the cladding;
  embrittlement of the cladding on quenching, caused by the sudden temperature drop during the massive supply of water for making the nuclear reactor core safe;
  low mechanical strength of the cladding after quenching or cooling, such as in the case of operations for post-accident maintenance.

Taking these risks into account, it is therefore essential to limit as far as possible the high-temperature oxidation of the cladding in order to improve the safety of nuclear reactors using for instance water as coolant.

Studies aim to improve the oxidation resistance of zirconium alloy subjected to a temperature above that encountered in service conditions. However, the temperatures encountered in accident conditions are not taken into account.

Document "FR 1493040 A" thus proposes coating a zirconium alloy with a layer of chromium. This monolayer coating is presented as making it possible to protect the zirconium alloy against oxidation at a temperature of 600° C., at atmospheric pressure and in carbon dioxide. However, as demonstrated experimentally below, the proposed coating is unable to significantly limit high-temperature oxidation.

It should moreover be noted that the conditions tested in no case allow prediction of the corrosion resistance of the zirconium alloy at a temperature above 600° C.

This lack of predictability is due to the fact that finding solutions against oxidation in accident conditions requires exploring a new field of research. In fact, as detailed below, the physicochemical conditions and the mechanisms of high-temperature oxidation are fundamentally different from those of oxidation at a temperature less than or equal to 600° C.

DESCRIPTION OF THE INVENTION

One of the aims of the invention is therefore to avoid, attenuate and/or delay the drawbacks described above, by proposing a material that could among other things provide significantly improved resistance to oxidation of zirconium-based nuclear fuel cladding in accident conditions, while preserving or even improving the oxidation resistance of this cladding in service conditions.

Another aim of the invention is to improve the mechanical properties of the material, such as its ductility and its mechanical strength, following oxidation in accident conditions.

Another aim of the invention is to reduce the production of gaseous hydrogen (hydrogen risk) or of hydrogen diffusing into the cladding (hydride-induced embrittlement).

The present invention thus relates to a multilayer material comprising a zirconium-based substrate covered with a multilayer coating, the multilayer coating comprising metallic layers composed of identical or different substances chosen from chromium, a chromium alloy or a ternary alloy of the Nb—Cr—Ti system.

In the present description of the invention, unless stated otherwise, the percentages of composition are expressed in atomic percentage.

Moreover, the metallic substances mentioned below (among others zirconium, chromium or their alloys, and/or the ternary alloy of the Nb—Cr—Ti system) may contain inevitable impurities from manufacture. The nature and the contents of these impurities are generally the natures and contents that are typical of the impurities of the industrial metallic substances used inter alia in the nuclear field and therefore compatible in particular with the specification requirements of this industry. Generally, the contents of the inevitable impurities are less than 200 ppm, preferably less than 100 ppm, still more preferably less than 50 ppm.

Finally, a verb such as "comprise", "contain", "incorporate", "include" and its conjugated forms are open terms and therefore do not exclude the presence of additional element(s) and/or step(s) that are added to the initial element(s) and/or step(s) stated after these terms. However, these open terms relate moreover to a particular embodiment in which only the initial element(s) and/or step(s), excluding all others, are intended; in which case the open term relates moreover to the closed term "consist of", "constitute of" and its conjugated forms.

Thus, the multilayer material of the invention may comprise a zirconium-based substrate covered with a multilayer coating, the multilayer coating consisting of the metallic layers composed of identical or different substances chosen from chromium, a chromium alloy or a ternary alloy of the Nb—Cr—Ti system.

In contrast to the materials of the prior art, the multilayer material of the invention only undergoes limited oxidation during a nuclear reactor accident, the conditions of which are among other things characterized by temperatures above 700° C., typically between 700° C. and 1200° C., or even in some cases between 800° C. and 1200° C. or between 1000° C. and 1200° C. This resistance to oxidation among other things makes it possible to limit hydrogen release or take-up and reduce the brittleness of a part composed partly or wholly of this material, for example nuclear fuel cladding.

Such results could be obtained despite the presence of physicochemical phenomena and of zirconium structures that are specific to the accident conditions and therefore do not allow application of the existing solutions in service conditions. These physicochemical phenomena and zirconium structures are detailed below for a zirconium alloy, while being transposable to zirconium as such.

In an accident situation, the zirconium alloy constituting the nuclear fuel claddings undergoes a series of transformations due not only to temperatures above 700° C. (or even above 800° C. or above 1000° C.), but also to diffusion of oxygen in the alloy. The specific conditions resulting therefrom are among others as follows:

hydriding: this is a phenomenon occurring within nuclear fuel cladding in nominal conditions or in certain accident conditions. The hydriding effect results from the following sequence of reactions (1) and (2): the zirconium contained in the nuclear fuel cladding is oxidized by the pressurized water or steam according to the reaction

$$Zr + 2H_2O \rightarrow ZrO_2 + 2H_2 \quad (1)$$

, then the hydrogen thus released diffuses into the zirconium alloy of the cladding and may form a hydride with the zirconium of the cladding that has not yet oxidized, according to the reaction

$$Zr + xH \rightarrow ZrH_x. \quad (2)$$

The subscript "x" indicates that hydrides of variable stoichiometry may be formed, this subscript being in particular equal to 2.

Depending on the total hydrogen content and/or the temperature, some or all of the hydrogen will be precipitated, the rest remaining in solid solution (inserted in the zirconium-alpha crystal lattice).

For example, at 20° C., almost all the hydrogen is precipitated in the form of hydrides whereas their dissolution may be total at high temperature (typically above 600° C.).

Hydrogen in solid solution, but especially in the form of precipitate of zirconium hydride, has the drawback of reducing the ductility of zirconium alloys, and therefore of causing embrittlement of the cladding, including at low temperature. This embrittlement is all the more to be feared when we aim to reach high burn-up fractions, because for these fractions an increase in the proportion of zirconium oxidized according to reaction (1) and therefore in the amount of hydrides formed according to reaction (2) is observed. It then generally leads to corrosion of the usual industrial alloys at prohibitive levels with respect to the criteria of safety and integrity of the cladding, and poses problems for post-service transport and storage.

Although observed in nominal conditions, in accident conditions the hydriding effect is generally only observed in the vicinity of 1000° C. This phenomenon, called "breakaway" and associated with an increase in oxidation kinetics, has not yet been fully elucidated. It results from the appearance of cracks and/or porosity in the $ZrO_2$ phase connected with the presence of stresses generated at the $Zr/ZrO_2$ interface probably connected with the reversible transformation of quadratic $ZrO_2$ to monoclinic $ZrO_2$. The consequences of this hydrogen uptake are, just as in nominal conditions, embrittlement of the material in the vicinity of 1000° C. that may lead to its fracture during quenching or after returning to low temperature.

release of hydrogen: aqueous corrosion at the surface of the zirconium alloy generally leads to dissociation of the water molecule. The resultant production of radical hydrogen leads to hydriding of the zirconium alloy. Now, for typical conditions of LOCA, i.e. exposure to temperatures above 1050° C. for 15 to 30 minutes, this hydriding effect is replaced by considerable release of molecular hydrogen ($H_2$).

"Zr-β" structure: the α phase of a zirconium alloy (designated "Zr-α", of hexagonal close-packed crystallographic structure) at low temperature is transformed to β phase (designated "Zr-β", of cubic body-centered crystallographic structure) in a temperature range typically of from 700° C. to 1000° C. which varies depending on the alloy, the heating rate, the content of hydrogen $H_2$, etc.

On transition from the Zr-α structure to the Zr-β cubic structure, the alloy undergoes local dimensional changes.

These variations are unfavorable a priori for the mechanical properties of a coating for covering a zirconium-based substrate, among other things on account of the incompatibility of their coefficients of expansion.

These problems of adherence are accentuated by the mechanisms of diffusion of chemical species, which are quicker in the Zr-β phase than in the Zr-α phase, and which may modify the interface between the substrate and its coating.

formation of "Zr-α (O)": the acceleration of diffusion also has the consequence that after formation of an outer layer of $ZrO_2$ on the surface of the zirconium alloy, oxygen continues its progression in the sound Zr-β phase, in contrast to what happens in service conditions.

Oxidation then continues beneath the outer layer of $ZrO_2$ until the oxygen reaches its solubility limit, which is relatively low in Zr-β, typically under 1 wt % at 1100° C.

The Zr-β is then transformed to Zr-α(O) solid solution, which may contain between 2 and 7 wt % of oxygen in solid solution, whereas only $ZrO_2$ is formed at low temperature.

During oxidation of a zirconium alloy at a temperature above 1000° C., there is therefore coexistence of three layers: $ZrO_2$, Zr-α (O) and Zr-β.

After core reflooding on activation of the nuclear reactor safety systems, the fuel claddings undergo quenching. The residual sound Zr-β is transformed again to Zr-α, called Zr-ex-β to differentiate it from the oxygen-rich Zr-α (O) formed at high temperature. For their part, the $ZrO_2$ and Zr-α (O) phases remain unchanged.

At the end of quenching, there are then the following successive layers from the outside surface to the inside surface of the cladding: $ZrO_2$, Zr-α (O), Zr-α (O)+Zr-ex-β, Zr-ex-β.

The presence of the phases $ZrO_2$, Zr-α(O) (or even Zr-ex-β if the oxygen content is high) causes embrittlement of the zirconium alloy constituting the cladding. This results in a risk of confinement rupture of the fissile material both at high temperature and during quenching or during the post-quench handling operations. Difficulties in cooling the fuel rod assemblies also arise during loss of geometry allowing cooling in the case of multiple fragmentations of these rods.

different structure of the $ZrO_2$ oxide: from monoclinic at moderate temperature, the $ZrO_2$ oxide is transformed to the quadratic phase around 1050° C. to 1100° C. This causes phenomena of instability in the layer of $ZrO_2$ oxide leading to particular oxidation mechanisms ("breakaway" phenomenon, especially in the vicinity of 1000° C.). The resultant internal stresses are a priori unfavorable to good adherence between the zirconium-based substrate and its coating.

Despite this context intrinsic to accident conditions, the inventors were able to develop a multilayer material that has improved resistance to oxidation in such conditions. Unexpectedly, this material has the further advantages that its multilayer coating displays good adherence to the zirconium-based substrate, despite local dimensional changes due to the Zr-β structure, acceleration of the mechanisms of diffusion and the phenomena of instability in the layer of $ZrO_2$ oxide. It also has good resistance to hydriding.

As demonstrated in the examples given below, these properties of the multilayer material of the invention are due to the combination of a particular structure and a particular composition.

The structure of the multilayer material is such that the coating results from the superposition of at least two metallic layers to form a multilayer coating that makes it possible to improve the resistance to oxidation, or even to hydriding, relative to a monolayer coating of identical composition.

A multilayer material differs from a monolayer material of equivalent overall chemical composition by among other things the presence of an interface between the layers. This interface is such that it generally corresponds to a disturbance of the microstructure at the atomic scale. It is for example identified using a technique for fine characterization such as high-resolution transmission electron microscopy (TEM), EXAFS (extended x-ray absorption fine structure spectroscopy), etc.

A multilayer material is generally obtained by a method for sequential deposition of different monolayers.

Besides the multilayer character, the structure of the multilayer material may be such that:
the multilayer coating comprises from 2 to 2000 metallic layers, preferably from 2 to 1000, still more preferably from 2 to 50 metallic layers, and/or;
each of the metallic layers has a thickness of at least 3 nm, preferably from 3 nm to 1 μm, and/or;
the cumulative thickness of the metallic layers is from 6 nm to 10 μm. The small cumulative thickness of the metallic layers makes it possible to limit the impact on the neutron behavior of the core of a nuclear reactor.
Unless stated otherwise, it should be noted that a cumulative thickness not exceeding 10 μm does not preclude making a multilayer material according to the invention in which the total thickness of the coating is greater than 10 μm, typically from 1 μm to 20 μm. For example, in addition to the metallic layers, the multilayer coating may comprise one or more additional layers, placed between two layers of the coating or on the surface of the coating, in order to endow it with at least one additional property.

Since the thickness of a metallic layer, the number and the cumulative thickness of these metallic layers are interdependent parameters, just two of these parameters may be defined in order to determine the third. Thus, for example, when the cumulative thickness of the metallic layers each of 3 nm is 10 μm, this means that the number of layers is 3334.

Preferably, in order to further improve resistance to oxidation in accident conditions, the multilayer coating comprises at least ten metallic layers each of which has a thickness of at least 100 nm, the cumulative thickness of the metallic layers being from 1 μm to 6 μm.

Regarding its composition, the multilayer material of the invention is such that the metallic layers making up the whole or part of the multilayer coating are composed of identical or different substances chosen from chromium, a chromium alloy or a ternary alloy of the Nb—Cr—Ti system. As the multilayer coating may be composed of layers with identical or different compositions, several embodiments are possible.

According to a first embodiment of the multilayer material of the invention, the multilayer coating is composite: the metallic layers are of different compositions. It is for example a multilayer coating designated "Cr/Nb—Cr—Ti", the metallic layers of which are composed of a chromium-based substance (chromium and/or chromium alloy), and a ternary alloy of the Nb—Cr—Ti system. Thus, the metallic layers are i) one or more layers composed of chromium and/or a chromium alloy and ii) one or more layers composed of the ternary alloy of the Nb—Cr—Ti system.

The layers with different compositions may be present in the composite multilayer coating in variable proportions, and arranged so that they alternate or are in a random order. However, a metallic layer composed of chromium or of chromium alloy, called intermediate bonding layer, is generally the one in contact with the zirconium-based substrate, with which it displays good adherence and compatibility.

According to a second embodiment, the multilayer coating has a major chromium content: the metallic layers are all composed of chromium and/or a chromium alloy, and form a multilayer coating designated "Cr/Cr". A multilayer material provided with such a coating has proved particularly resistant to oxidation in accident conditions.

According to a third embodiment, the multilayer coating has a minor chromium content: the metallic layers are all composed of a ternary alloy of the Nb—Cr—Ti system and form a multilayer coating designated "Nb—Cr—Ti/Nb—Cr—Ti".

Preferably, for these embodiments:
the chromium alloy is composed of from 80 to 99 at % of chromium, and/or;
the metallic layers composed of chromium or of a chromium alloy contain at least one chemical element chosen from silicon or yttrium, and such an element present for example at a content of from 0.1 to 20 at % may confer an additional improvement in corrosion resistance, and/or;
the metallic layer or layers composed of a ternary alloy of the Nb—Cr—Ti system supply additional ductility. They are then generally of small thickness, which is preferably from 5 nm to 500 nm, in order to limit the problems of neutron capture or of activation under flux.

Ternary alloy of the Nb—Cr—Ti system is the designation used by a person skilled in the art to denote this type of alloy, but this does not correspond to a defined nomenclature or stoichiometry. This ternary alloy of the Nb—Cr—Ti system is described for example in the publication "D. L. DAVIDSON, K. S. CHAN, and D. L. ANTON, The Effects on Fracture Toughness of Ductile-Phase Composition and Morphology in Nb—Cr—Ti and Nb—Si In Situ Composites, METALLURGICAL AND MATERIALS TRANSACTIONS A, 27A (1996) 3007-3018". It may for example comprise, in atomic percentages, from 50% to 75% of niobium, from 5% to 15% of chromium and from 20% to 35% of titanium, which is equivalent to a ternary alloy comprising by weight from 65% to 85% of niobium, from 3% to 11% of chromium and from 12% to 24% of titanium.

Regarding the composition of the substrate, it is zirconium-based, i.e. it contains between 50 and 100 at % of zirconium. The substrate is therefore of zirconium or a zirconium alloy. The zirconium alloy may be chosen from Zircaloy-2, Zircaloy-4, Zirlo™ or M5™. These zirconium alloys are well known by a person skilled in the art in the nuclear field. The compositions of these alloys are such that they comprise for example, by weight:

Zircaloy-2 alloy: 1.20% to 1.70% of Sn; 0.07% to 0.20% of Fe; 0.05% to 1.15% of Cr; 0.03% to 0.08% of Ni; 900 ppm to 1500 ppm of O; remainder zirconium Zircaloy-4 alloy: 1.20% to 1.70% of Sn; 0.18% to 0.24% of Fe; 0.07% to 1.13% of Cr; 900 ppm to 1500 ppm of O; less than 0.007% of Ni; remainder zirconium Zirlo alloy: 0.5% to 2.0% of Nb; 0.7% to 1.5% of Sn; 0.07% to 0.28% of at least one element chosen from Fe, Ni, Cr; up to 200 ppm of C; remainder zirconium M5 alloy: 0.8% to 1.2% of niobium; 0.090% to 0.149% of oxygen; remainder zirconium.

The substrate generally constitutes a massive element. This massive element may be devoid of any coating, and constitutes for example a component part of a nuclear reactor, such as nuclear fuel cladding, a guide tube, a spacer grid or a plate fuel.

The invention also relates to a multilayer coating as such comprising metallic layers composed wholly or partly of a ternary alloy of the Nb—Cr—Ti system.

When all the metallic layers are composed of a ternary alloy of the Nb—Cr—Ti system, it is the multilayer coating with minor chromium content designated "Nb—Cr—Ti/Nb—Cr—Ti".

When a portion of the metallic layers is composed of the ternary alloy of the Nb—Cr—Ti system, the composite multilayer coating is for example such that the metallic layers are i) one or more layers composed of chromium and/or a chromium alloy and ii) one or more layers composed of the ternary alloy of the Nb—Cr—Ti system (multilayer coating designated "Cr/Nb—Cr—Ti").

The multilayer coating of the invention comprises at least two layers, and if necessary in addition an outer bonding layer. This bonding layer is positioned on one face of the multilayer coating, to facilitate subsequent bonding with a substrate. It is preferably composed of chromium or a chromium alloy, including when the substrate is composed of zirconium or zirconium alloy. This outer bonding layer will constitute the intermediate bonding layer when the substrate is provided with the multilayer coating.

The multilayer coating of the invention may be according to one or more of the variants described above for the multilayer material, among others the variants relating to its structure and/or its composition.

If applicable, the multilayer coating of the invention may be deposited on a substrate by a process such as assembly by diffusion, carried out for example by heating the multilayer coating to a temperature of from 500° C. to 600° C.

The invention also relates to a part composed wholly or partly of the multilayer material or of the multilayer coating of the invention as defined above, the part being a component of a nuclear reactor, for example of the pressurized water reactor type ("PWR"), boiling water reactor ("BWR") or fourth generation reactors.

The part is for example a tubular part such as nuclear fuel cladding or a guide tube, a spacer grid or a plate fuel (intended for example for a fast neutron reactor of type FNR-G).

Preferably, the multilayer material or the coating covers the external surface of the part.

The invention also relates to the use of a multilayer material, of a multilayer coating or of a part according to any one of the preceding claims, in order to improve the oxidation resistance of a zirconium-based substrate in accident conditions in a nuclear environment.

The invention also relates to a method for manufacturing a multilayer material as defined above, especially in one or more of the variants of this material, comprising a step in which a zirconium-based substrate is covered with a multilayer coating comprising metallic layers composed of identical or different substances chosen from chromium, a chromium alloy or a ternary alloy of the Nb—Cr—Ti system.

Preferably, the substrate is covered with a multilayer coating by performing sequential deposition of the metallic layers, i.e. deposition in which the metallic layers are deposited one after another. For this, sequential deposition comprises at least one pause time separating the deposition of each of the metallic layers and during which deposition ceases.

A great variety of techniques of sequential deposition may be envisaged.

For example, a technique of sequential deposition may be chosen in such a way that the multilayer coating produced is sufficiently dense to cover, without major defects of hermeticity, the substrate or the lower metallic layer on which deposition is carried out, the structure and the usual properties of the latter not being notably affected. For this purpose, the substrate may be covered by carrying out sequential deposition using an operation of physical vapor deposition (PVD), chemical vapor deposition (CVD) or electrodeposition (for example by pulsed electrolysis).

During manufacture of the multilayer material, the zirconium-based substrate should preferably not be subjected to a temperature above the temperature of the last thermal treatment that it underwent during its manufacture, for example sequential deposition is carried out at a temperature of at most 580° C. as is recommended for a recrystallized state of Zr—Nb alloy. This makes it possible to avoid a metallurgical modification such as a partial transformation into Zr-β phase, which may adversely affect the properties, for example mechanical properties, of the substrate.

Therefore it is generally preferable to use deposition by PVD, as it is rapid and allows a multilayer coating to be produced at a moderate temperature, typically of from 50° C. to 700° C. Preferably, physical vapor deposition is carried out at a temperature of from 200° C. to 600° C., preferably of from 200° C. to 450° C.

Preferably, the physical vapor deposition is cathodic sputtering.

Cathodic sputtering consists of producing thin layers by ejection of atoms from a target material during bombardment with rare gas ions accelerated under high voltage. The ejected atoms then form a metal vapor that condenses on the surface of a substrate to form a coating.

Cathodic sputtering may be carried out using a flat cathode and a flat target, or a cylindrical cathode and a hollow target containing the substrate.

Preferably, cathodic sputtering is of the magnetron type. A magnetron is a set of permanent magnets situated under the target in order to increase the ion density in the vicinity of the latter. The magnetron effect makes it possible to maintain the discharge with a lower pressure, thus improving sputtering quality.

Magnetron cathodic sputtering is now a rapid, reproducible method, allowing a dense coating to be produced. It is familiar to a person skilled in the art, and is described for example in the document "Techniques de l'ingénieur, pulvérisation cathodique magnètron" [Engineering techniques, magnetron cathodic sputtering], Reference M1654".

The invention also relates to a multilayer material obtained or obtainable by the method of manufacture of the invention.

Other aims, features and advantages of the invention will now be specified in the following description of particular embodiments of the method of the invention, given by way of nonlimiting illustration, referring to the appended FIGS. 1 to 22.

Figure 6:
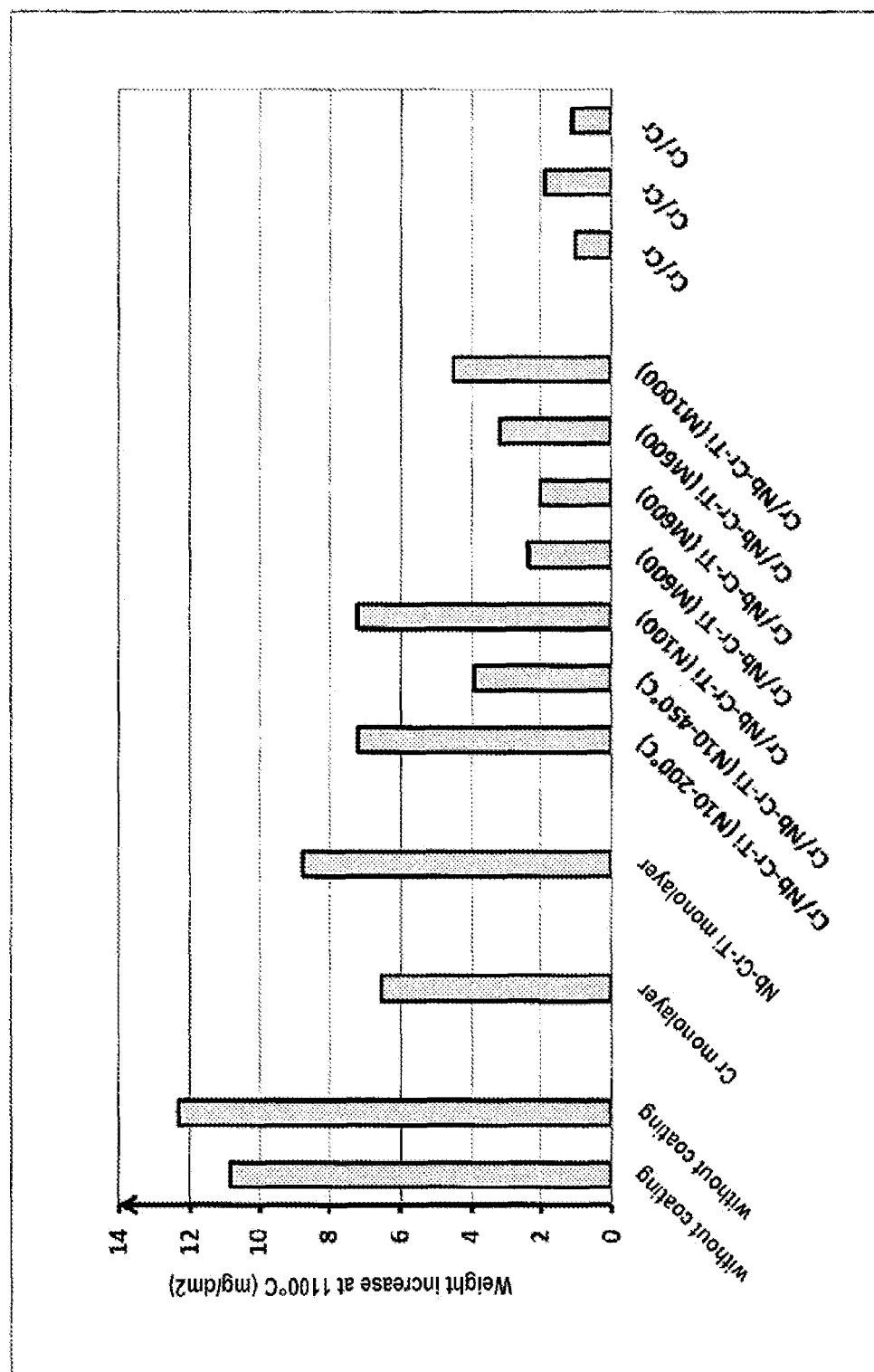

The diagram in FIG. 6 illustrates the weight increase in accident conditions, after 850 seconds, of materials consisting of a substrate of Zircaloy-4 with or without a monolayer or multilayer coating. The micrographs in optical microscopy on polished sections in FIGS. 7 to 12 illustrate this weight increase, for materials consisting of a substrate of Zircaloy-4:
  without coating (FIG. 7),
  with a Nb—Cr—Ti monolayer coating (FIG. 8),
  with a Cr/Nb—Cr—Ti multilayer coating of reference M600 (FIG. 9) or of reference M1000 (FIG. 10),
  with a Cr monolayer coating (FIG. 11),
  with a Cr/Cr multilayer coating (FIG. 12).

Figure 16:
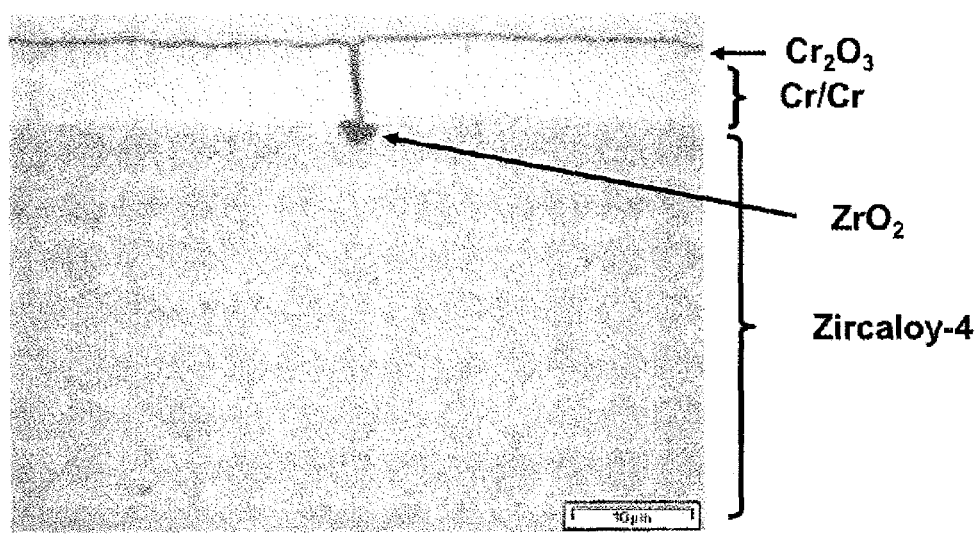
Figure 17:
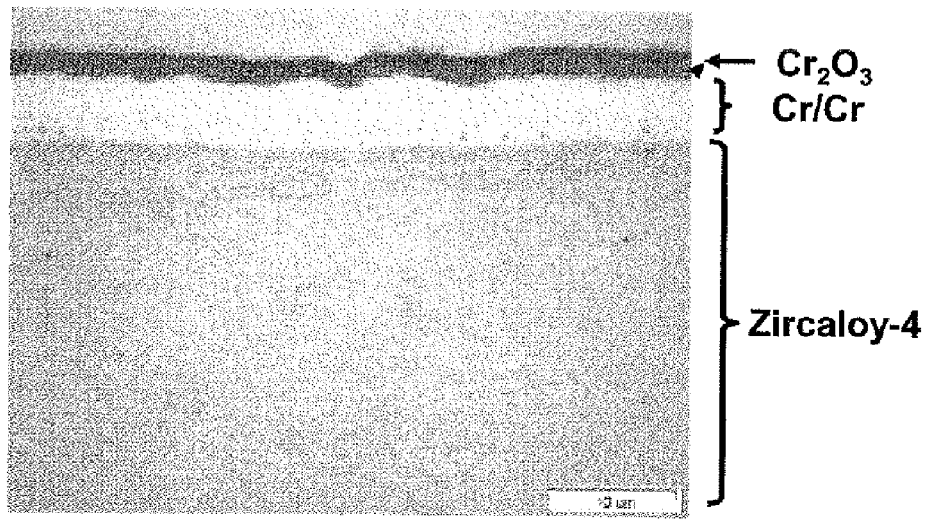
Figure 18:
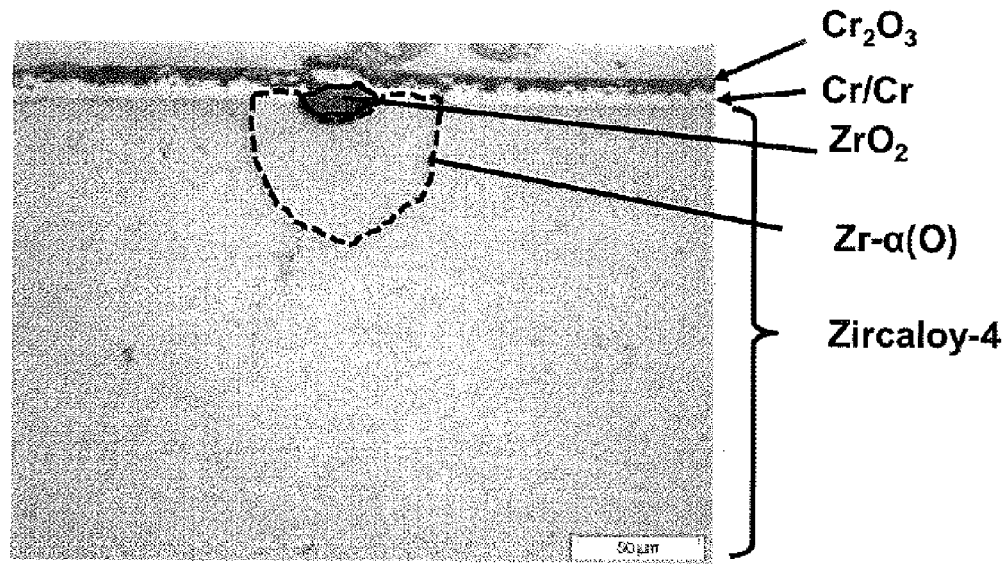

FIGS. 13 to 18 are micrographs obtained by light microscopy on polished sections of materials consisting of a substrate of Zircaloy-4:
  without coating, after undergoing oxidation in nominal conditions (FIG. 13) and then oxidation in accident conditions (FIG. 14),
  with Cr monolayer coating, after undergoing oxidation in nominal conditions and then in accident conditions (FIG. 15),
  with Cr/Cr multilayer coating, after undergoing oxidation in nominal conditions (FIG. 16) and then oxidation in accident conditions (FIG. 17). FIG. 18 is a micrograph of the material in FIG. 17 of a zone not shown in this figure and in which the coating has a crack.

Figure 19:
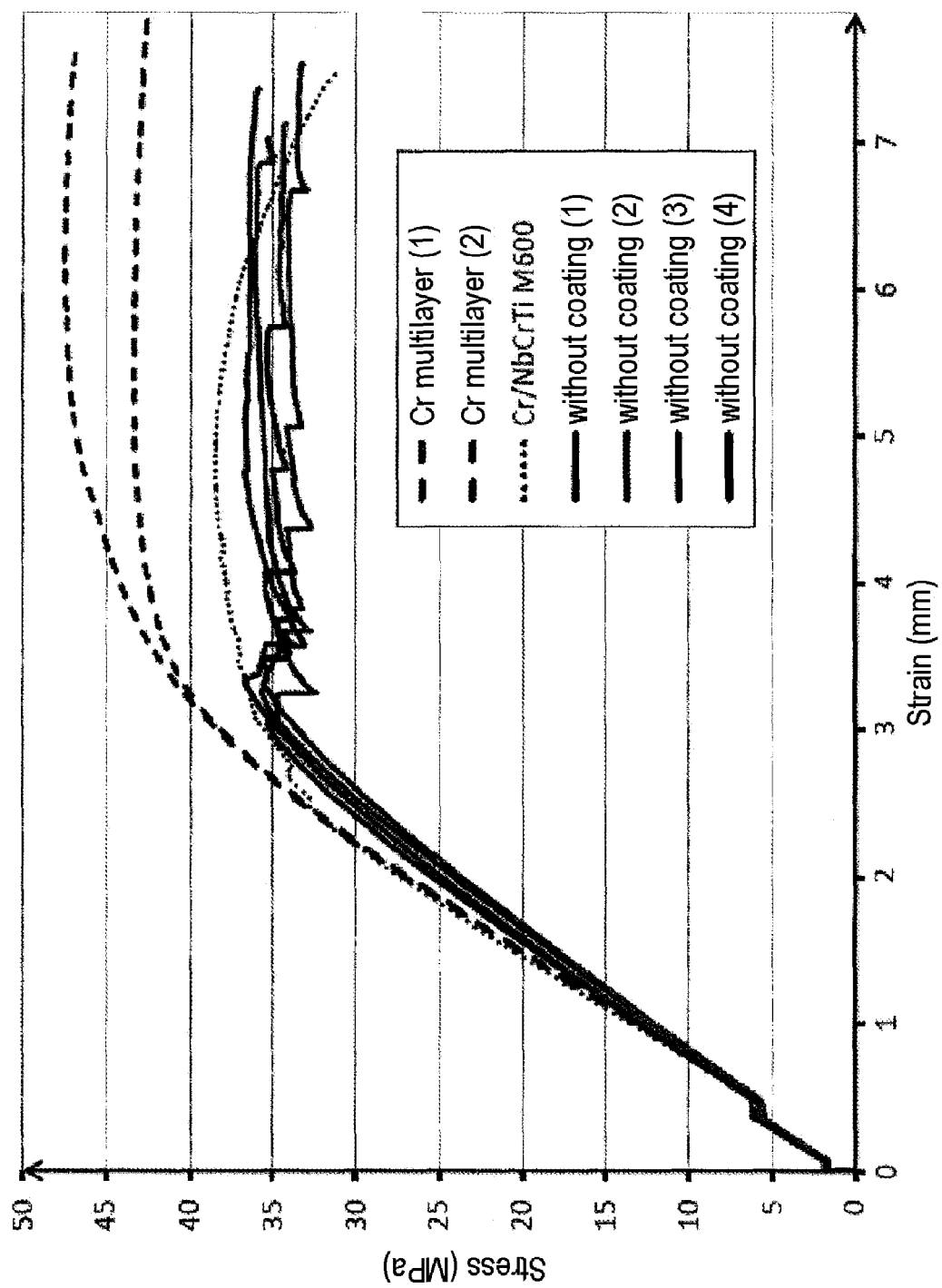

FIG. 19 shows the bending strain at room temperature as a function of a stress applied to test specimens of Zircaloy-4 without coating and with Cr/Nb—Cr—Ti and Cr/Cr multilayer coatings.

Figure 20:
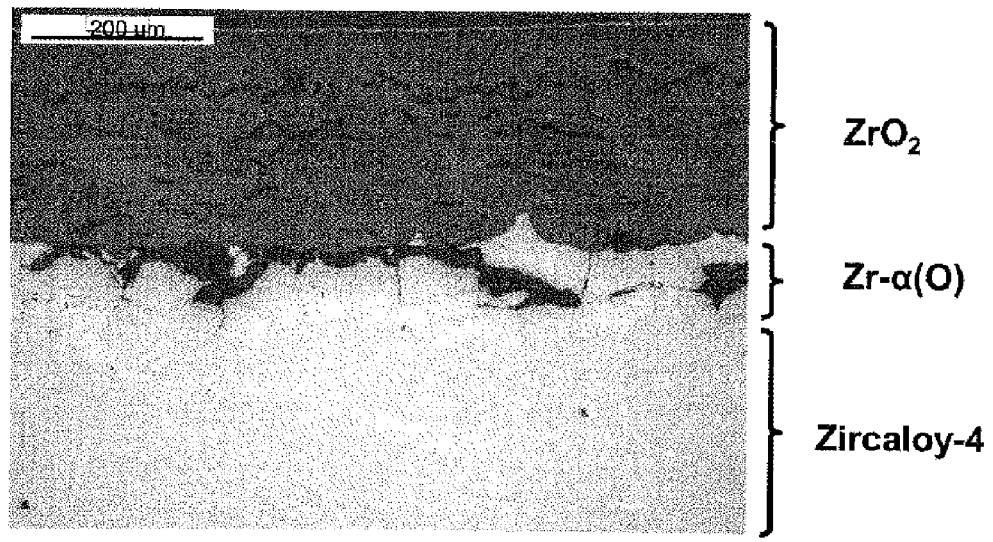
Figure 21:
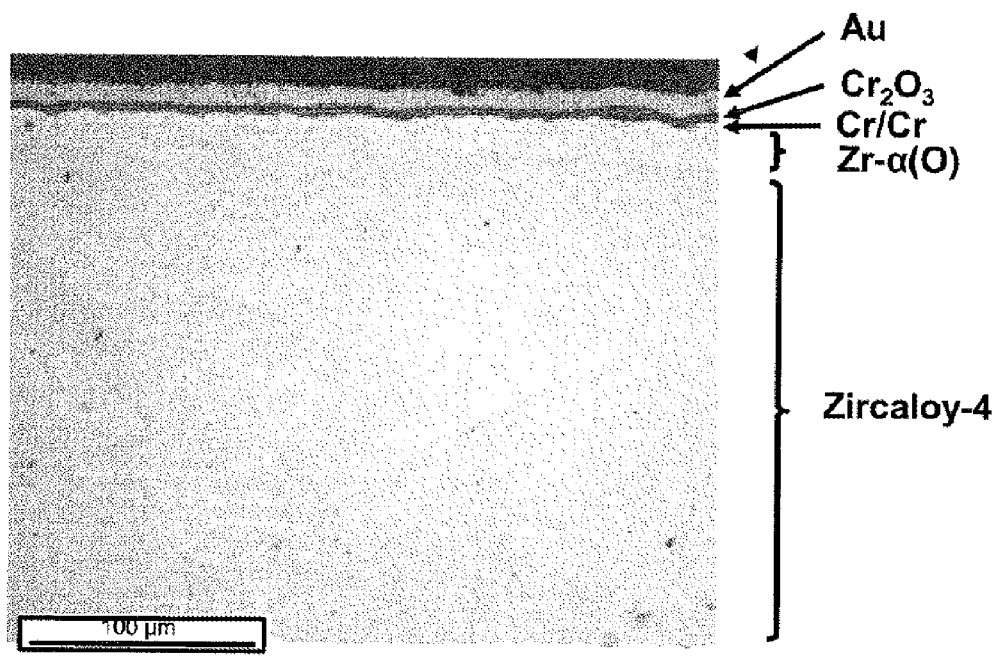

FIGS. 20 and 21 are SEM images that illustrate the oxidation after 15000 seconds under steam at 1000° C., for materials consisting of a substrate of Zircaloy-4 without coating (FIG. 20) and provided with a Cr/Cr multilayer coating (FIG. 21). The effects of this oxidation are illustrated by the graph in FIG. 22, which shows the evolution of the weight increase over time for the materials consisting of a substrate of Zircaloy-4 without coating (straight line 1) and provided with a Cr/Cr multilayer coating (straight line 2).

DESCRIPTION OF PARTICULAR EMBODIMENTS

In the following examples, various materials are produced by deposition on a substrate of Zircaloy-4:
  i) control monolayer coatings composed of chromium or a ternary alloy of the Nb—Cr—Ti system, and
  ii) multilayer coatings according to the invention alternating with layers of chromium (Cr/Cr), or layers of chromium and layers of the ternary alloy of the Nb—Cr—Ti system (Cr/Nb—Cr—Ti).

All the coatings have similar thicknesses.

The ternary alloy of the Nb—Cr—Ti system chosen is the alloy $Nb_{67}\%$ $Cr_{10}\%$ $Ti_{23}\%$, the formula of which is expressed in atomic percentage.

The resistance to oxidation and to hydriding, the structural characteristics and the mechanical properties of the materials are tested in nominal conditions (360° C., water at 190 bar) and in conditions representative of an accident of the LOCA type (1100° C., steam) with or without prior oxidation in nominal conditions, according to the conditions representative of those encountered for a nuclear reactor of the PWR type.

The structural analyses are in particular performed by optical microscopy on polished sections. For this purpose, the plates of the materials analyzed are prepared by covering them with a platinum coating (flash) and a gold coating (electrolytic) before embedding in a resin for polishing. These platinum and gold protective coatings prevent the monolayer or multilayer PVD coating, which has become brittle through oxidation, becoming detached during polishing. They also make it possible to improve the image quality in the microscope by electron conduction. These protective coatings are indicated on the micrographs when they appear sufficiently clearly.

1. MANUFACTURE OF MULTILAYER MATERIALS ACCORDING TO THE INVENTION AND OF MATERIALS PRODUCED FOR COMPARISON

The technique of magnetron cathodic sputtering is employed for manufacturing the aforementioned materials.

Plates of Zircaloy-4 with the dimensions 45 mm×14 mm×1.2 mm are degreased in a strong alkaline solution, rinsed with water, cleaned ultrasonically for 30 minutes in a bath of acetone, and then rinsed with ethanol and stoved.

They are then placed in a cathodic sputtering reactor, and cleaned in situ, operating with an argon partial pressure of 4 Pa and a polarization voltage of 600 V.

On both faces of each plate of Zircaloy-4, the monolayer coatings of pure chromium or of $Nb_{67}\%$ $Cr_{10}\%$ $Ti_{23}\%$, as well as the corresponding multilayer coatings (Cr/Cr or Cr/Nb$_{67\%}$Cr$_{10\%}$Ti$_{23\%}$) are deposited at 200° C. by cathodic sputtering of chromium targets and of composite targets having inserts of niobium, of chromium and of titanium in suitable proportions.

The argon partial pressure is 0.5 Pa, it is generally between 0.05 Pa and 2 Pa.

The polarization voltage is −100 V. It is typically between −10 V and −400 V.

To facilitate its adherence, the Nb—Cr—Ti monolayer coating is made on a 500-nm bonding layer of chromium covering the Zircaloy-4. The thickness of the bonding layer may be decreased in order to limit its impact on the overall composition of the coating, especially when the coating comprises few layers.

The Cr/Cr multilayer coatings are produced by interrupting the magnetron discharge several times during deposition, each discharge being separated by a pause time.

The Cr/Nb—Cr—Ti multilayer coatings are produced by alternately passing the samples opposite each target of Cr and then of Nb—Cr—Ti, with a discharge time opposite each target fixed as a function of the desired period "A". The kinematics of the metal precursors in the enclosure allows precise control of the thickness of each elementary layer forming the multilayer coating. This control is possible starting from a layer thickness of 3 nm.

The operating conditions of magnetron cathodic sputtering and the characteristics of the coatings obtained are shown in Table 1. A period corresponds to the production of a layer of chromium for the Cr/Cr multilayer coatings, or to the motif resulting from the addition of a layer of Cr and a layer of Nb—Cr—Ti deposited successively for the Cr/Nb—Cr—Ti multilayer coatings.

Figure 1:
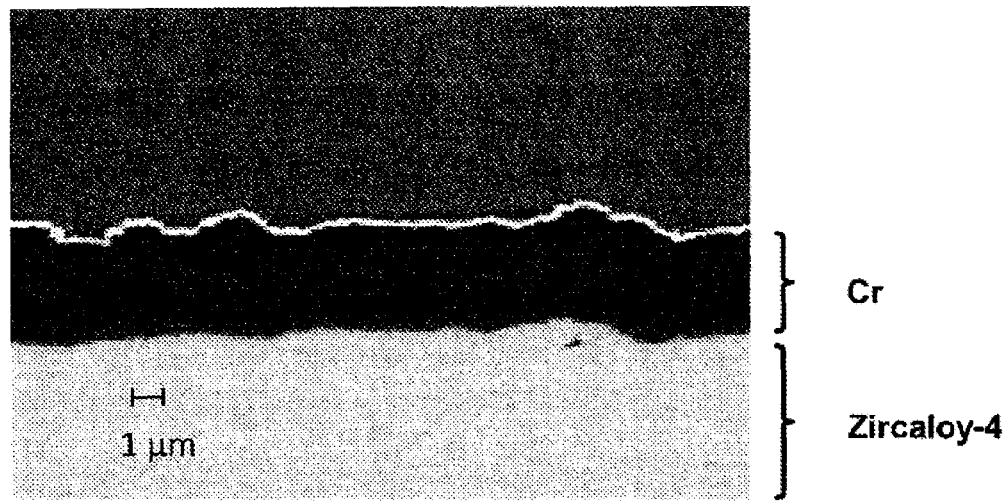
FIGS. 1 to 4 show scanning electron microscopy (SEM) images of materials consisting of a substrate of Zircaloy-4 provided with a Cr monolayer coating (FIG. 1), Cr/Cr multilayer coating (FIG. 2), Nb—Cr—Ti monolayer coating (FIG. 3) and Cr/Nb—Cr—Ti multilayer coating (FIG. 4).
Figure 2:
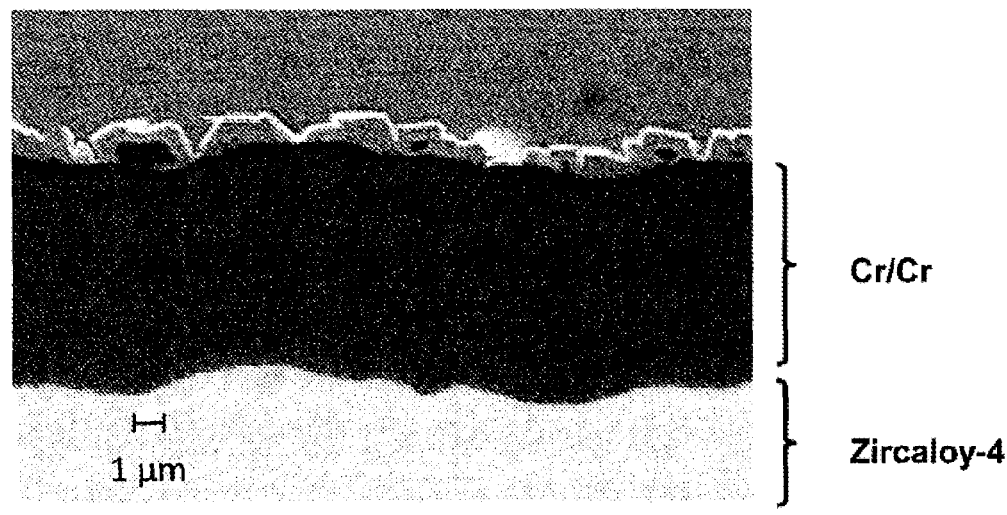
Figure 3:
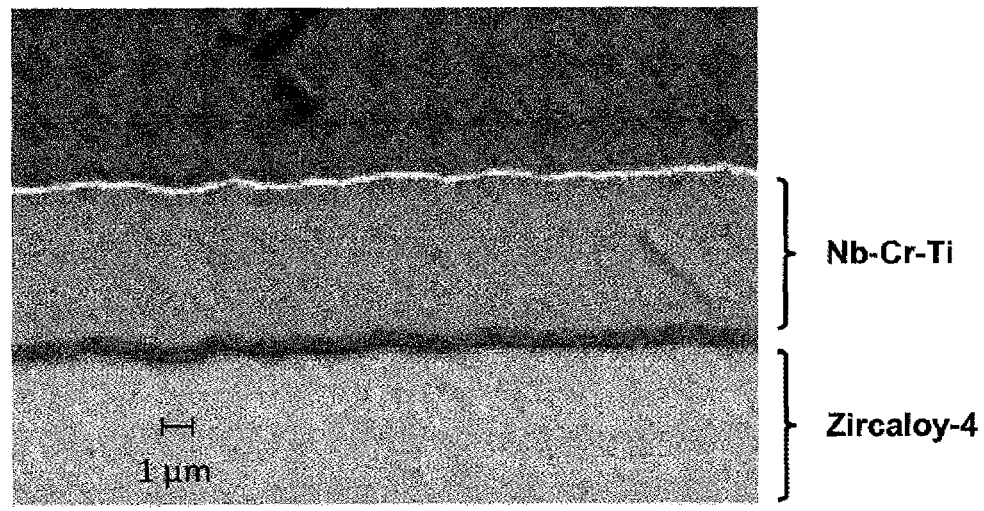
Figure 4:
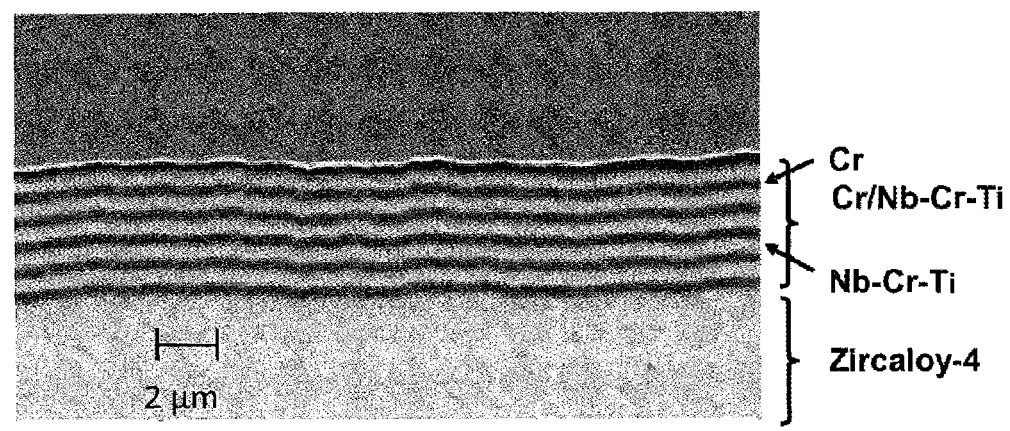

The Cr/Nb—Cr—Ti multilayer coating shown in FIG. 4 is that which has a period $\lambda$=2×300 nm (reference M600 in Table 1), the FIG. 2 indicating the presence of two layers in one and the same period. The light gray and dark gray layers correspond respectively to the layers of the Nb—Cr—Ti alloy and to the layers of chromium.

These images reveal that the coatings are dense, of uniform thickness and have good adherence to the substrate of Zircaloy-4, without significant defects at the interface.

2. MEASUREMENT OF CORROSION IN NOMINAL CONDITIONS (T=360° C.) AND MICROSTRUCTURE

To evaluate their resistance to oxidation, the zirconium-based plates provided with coating produced in example 1 (with the exception of the plate with Cr/Nb—Cr—Ti multilayer coating of reference M1000) remain for 60 days in an autoclave whose environment is representative of the conditions in nominal operation of a nuclear reactor of the PWR type.

For purposes of comparison, a control plate of Zircaloy-4 without coating, similar in thickness to the plates with coating, is added.

The environment in the autoclave is water containing 650 ppm of boron and 10 ppm of lithium, heated to 360° C. and pressurized to 190 bar.

Intermediate stops at 10 days and 30 days make it possible to measure the weight increase, reflecting the oxygen uptake, for the various plates.

Figure 5:
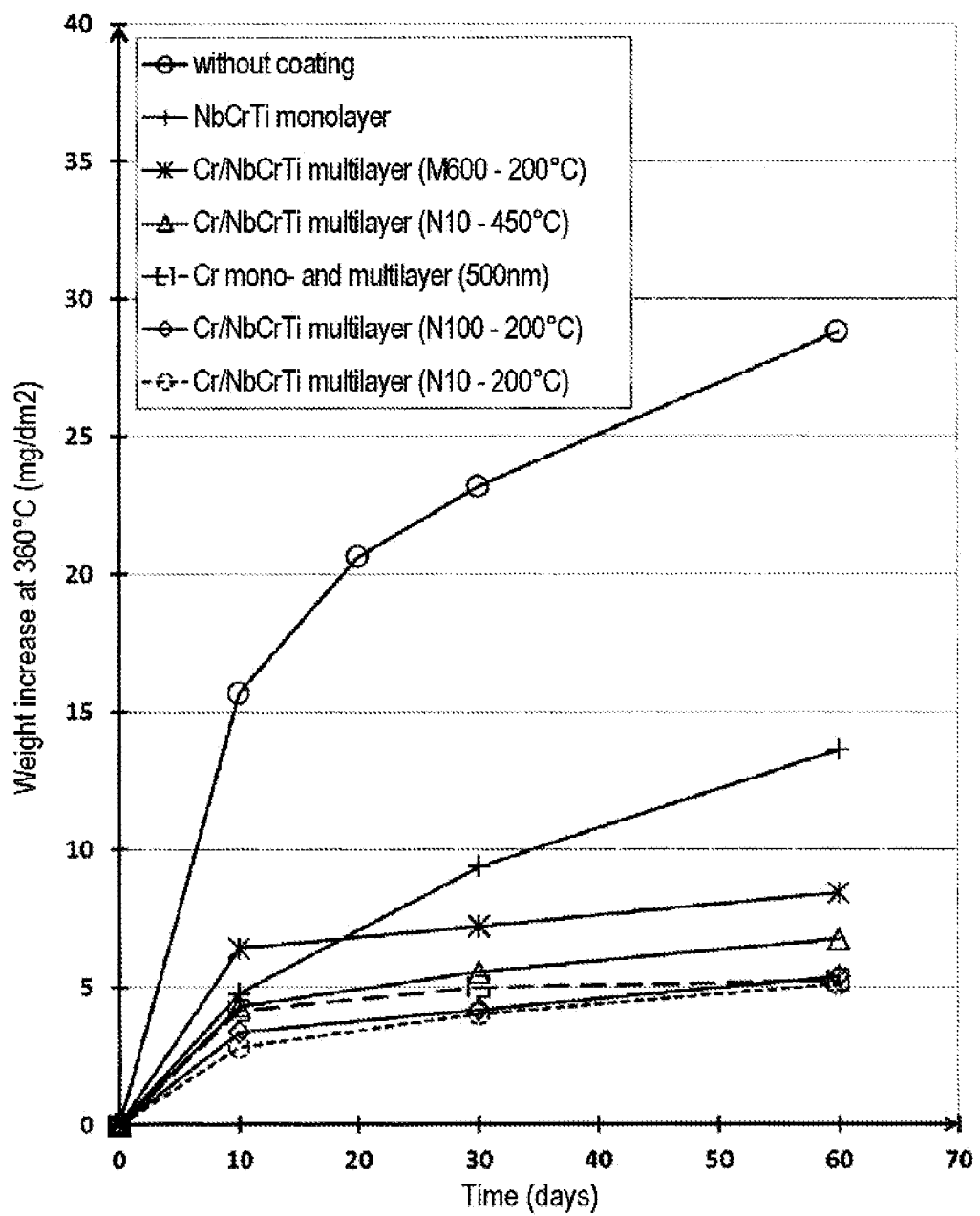
FIG. 5 is a graph of the weight increase in nominal conditions, as a function of time, of materials consisting of a substrate of Zircaloy-4 with or without a monolayer or multilayer coating.

The results for the weight increases up to 60 days presented in FIG. 5 show that all the monolayer and multilayer

TABLE 1

| Nature of the coating | Name | Coating architecture | Cumulative thickness of the coating (μm) | Temperature (° C.) | Power (W) |
|---|---|---|---|---|---|
| Cr | Cr | Monolayer | 1 to 5 | 200 | 400 (Cr) |
| Cr | Cr/Cr | Multilayer $\lambda$ = 500 nm 14 periods | 7 | 200 | 400 (Cr) |
| Nb$_{67\%}$Cr$_{10\%}$Ti$_{23\%}$ (at %) | NbCrTi | Monolayer (with 500-nm bonding layer of Cr) | 4 | 400 | 450 (NbCrTi) |
| Cr and Nb$_{67\%}$Cr$_{10\%}$Ti$_{23\%}$ (at %) | Cr/NbCrTi N10 | Multilayer $\lambda$ = 2 × 5 nm >500 periods | 5 to 6 | 200 450 | 400 (Cr) 450 (NbCrTi) |
| Cr and Nb$_{67\%}$Cr$_{10\%}$Ti$_{23\%}$ (at %) | Cr/NbCrTi N100 | Multilayer $\lambda$ = 2 × (50 to 80) nm 40 periods | 5.5 | 200 | 400 (Cr) 450 (NbCrTi) |
| Cr and Nb$_{67\%}$Cr$_{10\%}$Ti$_{23\%}$ (at %) | Cr/NbCrTi M600 | Multilayer $\lambda$ = 2 × 300 nm 10 periods | 6 | 200 | 400 (Cr) 450 (NbCrTi) |
| Cr and Nb$_{67\%}$Cr$_{10\%}$Ti$_{23\%}$ (at %) | Cr/NbCrTi M1000 | Multilayer $\lambda$ = 2 × 400 nm 5 periods | 4 | 200 | 400 (Cr) 450 (NbCrTi) |

The microstructure of the coatings is observed by SEM on polished section. It is presented in FIGS. 1 to 4, which show the substrate of Zircaloy-4 and the layers of chromium and of Nb—Cr—Ti.

The interfaces between the 14 layers of the Cr/Cr multilayer coating are not visible in the image in FIG. 4. They may, however, be visualized using a high-resolution technique such as transmission electron microscopy (TEM).

coatings containing chromium lead to a significant improvement in oxidation resistance in nominal conditions relative to the control plate of Zircaloy-4 without coating.

Relative to the Cr monolayer coating, the resistance to oxidation in nominal conditions is similar for the Cr/Cr multilayer coating, or even higher for two Cr/Nb—Cr—Ti multilayer coatings (references N10-200° C. and N100-200° C.) when exposure to oxidation is less than 60 days.

These results are confirmed by measuring the thickness of the layer of oxide on the Zircaloy-4 plates, which is from 1.8 µm of zirconia ($ZrO_2$) in the absence of coating, to less than 0.4 µm of chromium oxide ($Cr_2O_3$) with the multilayer coatings that prevent formation of zirconium oxide in the underlying substrate, with the possible exception of oxidation opposite cracks present in the coating.

Moreover, micrographs in optical microscopy on polished section (not reproduced here) are taken on the section of a plate of Zircaloy-4 with Cr/Nb—Cr—Ti multilayer coating (reference M600 in Table 1). They confirm that this coating prevents the formation of $ZrO_2$ that was found for a control plate without coating. This property is obtained owing to the formation of a protective layer of chromium oxide ($Cr_2O_3$) with thickness of 100 nm on the surface of the coating, constituting a diffusion barrier to oxygen, limiting or even preventing the formation of $ZrO_2$ beneath the multilayer coating.

Relative to a monolayer material with Cr coating, it therefore appears that the multilayer materials with Cr/Cr or Cr/Nb—Cr—Ti coating preserve good resistance to oxidation in nominal conditions, or even improve it for a Cr/Nb—Cr—Ti coating.

3. MEASUREMENT OF CORROSION AFTER 850 SECONDS IN ACCIDENT CONDITIONS UNDER STEAM (T=1100° C.) AND MICROSTRUCTURE

Tests are conducted in order to evaluate the oxidation resistance, in accident conditions, of the zirconium-based plates produced in example 1.

The conditions are those of an accident of the LOCA type during which the temperature of the nuclear fuel cladding increases rapidly to above 800° C. or even above 1050° C. and may even reach 1200° C., and then decreases sharply following quenching by the water from the security sprinklers with the aim of flooding the core again. The conditions of the tests correspond to the envelope conditions of an LOCA accident taken into account in the safety calculations.

The plates are held at the end of an alumina rod, and are then placed for 850 seconds in an enclosure in which there is circulation of steam heated to 1100° C. by a furnace permitting oxidation in steam.

The plates are then dropped into a quenching bath filled with water at room temperature. The bottom of the bath is provided with a cushion breaking the fall of the plates and a white cloth for recovering the particles that become detached from the plates in the event of exfoliation of the phases that underwent embrittlement following the thermal shock of quenching.

3.1. Measurement of the Weight Increase

The oxidized plates and any exfoliated fragments are weighed to determine the weight increase due to the amount of oxygen that has diffused into the plates.

Measurement is repeated once for the Zircaloy-4 plate without coating, and twice for the plates with Cr/Nb—Cr—Ti multilayer coating (reference M600) and with Cr/Cr multilayer coating. The difference obtained in the values for one and the same plate is due to experimental scatter.

The weight increases measured are presented in Table 2 and are illustrated by the diagram in FIG. 6.

TABLE 2

| Plate | Weight increase at 1100° C. (mg/cm$^2$) |
|---|---|
| Zircaloy-4 without coating | 10.82 |
| Zircaloy-4 without coating | 12.32 |
| Zircaloy-4 with Cr monolayer coating | 6.55 |
| Zircaloy-4 with Nb—Cr—Ti monolayer coating | 8.75 |
| Zircaloy-4 with Cr/Nb—Cr—Ti coating (N10-200° C.) | 7.22 |
| Zircaloy-4 with Cr/Nb—Cr—Ti coating (N10-450° C.) | 3.92 |
| Zircaloy-4 with Cr/Nb—Cr—Ti coating (N100) | 7.22 |
| Zircaloy-4 with Cr/Nb—Cr—Ti coating (M600) | 2.37 |
| Zircaloy-4 with Cr/Nb—Cr—Ti coating (M600) | 2.04 |
| Zircaloy-4 with Cr/Nb—Cr—Ti coating (M600) | 3.16 |
| Zircaloy-4 with Cr/Nb—Cr—Ti coating (M1000) | 4.5 |
| Zircaloy-4 with Cr/Cr multilayer coating | 1.01 |
| Zircaloy-4 with Cr/Cr multilayer coating | 1.88 |
| Zircaloy-4 with Cr/Cr multilayer coating | 1.1 |

These data suggest that the Cr/Nb—Cr—Ti and Cr/Cr multilayer coatings improve oxidation resistance in accident conditions, not only relative to absence of a coating, but also significantly relative to the corresponding Cr or Nb—Cr—Ti monolayer coatings.

This resistance is particularly improved for the multilayer coatings containing at least 10 layers (and therefore with a minimum layer thickness of 100 nm, preferably between 100 nm and 500 nm), more particularly for the Cr/Nb—Cr—Ti multilayer coatings of reference M600 (10 periods) and Cr/Cr multilayer coatings.

It should nevertheless be noted that, although to evaluate the level of oxidation of Zircaloy-4, the weight increase can be directly correlated with the oxygen uptake in the case of Zircaloy-4 without coating (formation of $ZrO_2$ and of Zr-α (O) in known proportions), this is not possible a priori in accident conditions for coated specimens as the oxidation of the coatings also contributes significantly to this weight increase.

Such a correlation is, however, possible in nominal conditions in view of the very limited oxidation of the coatings.

3.2. Structure and Measurement of the Thickness of the Oxidized Layers

In addition, the thickness of the $ZrO_2$ and Zr-α(O) phases in the plates with coating is evaluated using microstructural examination by optical microscopy on polished section.

Figure 9:
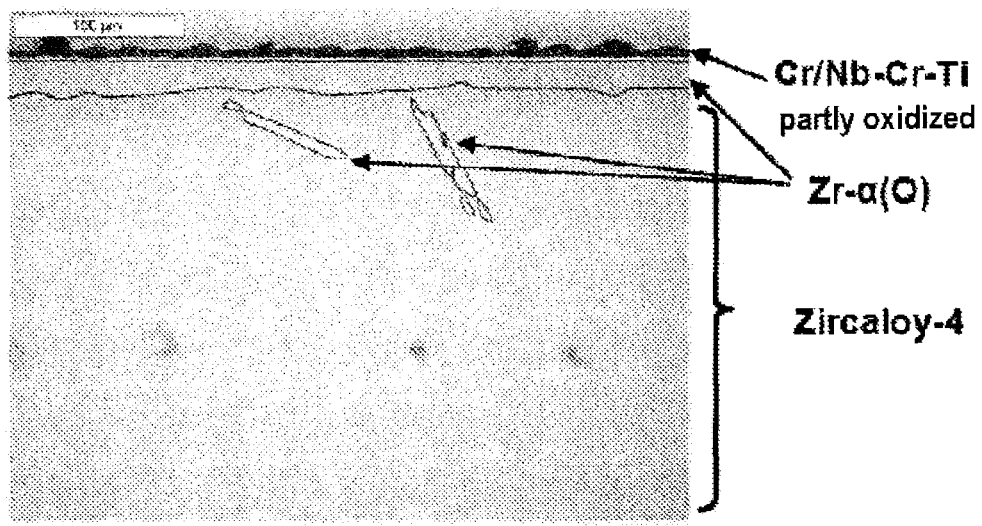
Figure 10:
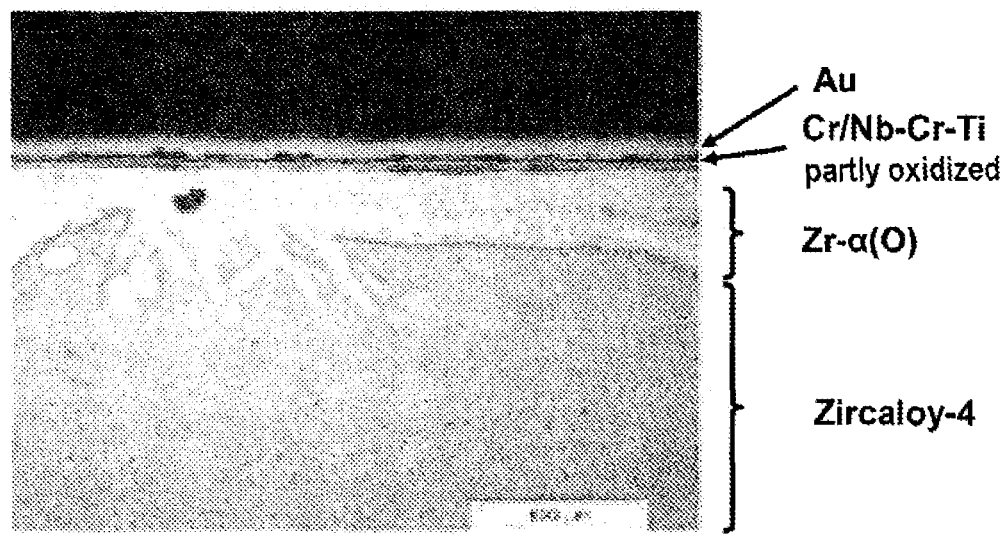

The micrographs obtained show the microstructures after oxidation in accident conditions of the plates without coating (FIG. 7), and of the plates with Nb—Cr—Ti monolayer coating (FIG. 8), Cr/Nb—Cr—Ti multilayer coatings (reference M600: FIG. 9; reference M1000: FIG. 10), Cr monolayer coating (FIG. 11) and Cr/Cr multilayer coating (FIG. 12) that led to the smallest weight increases at 1100° C.

Figure 7:
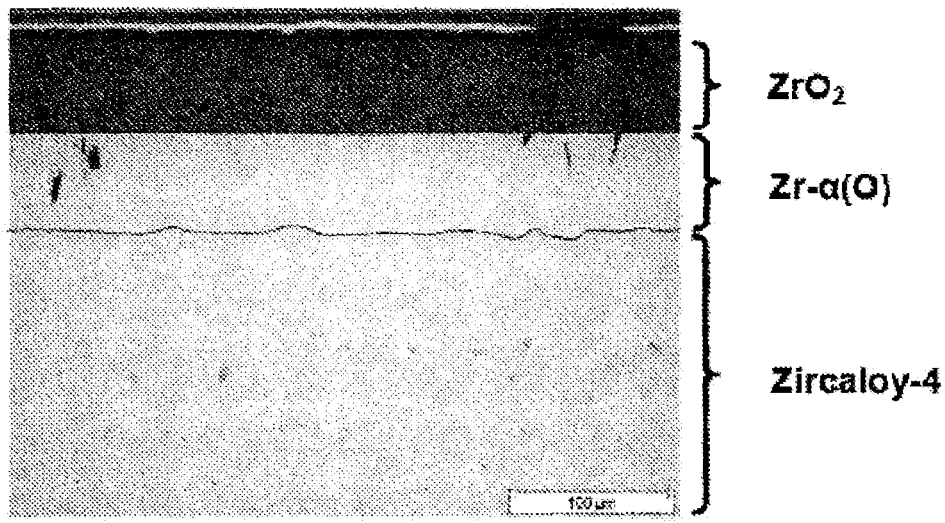
Figure 8:
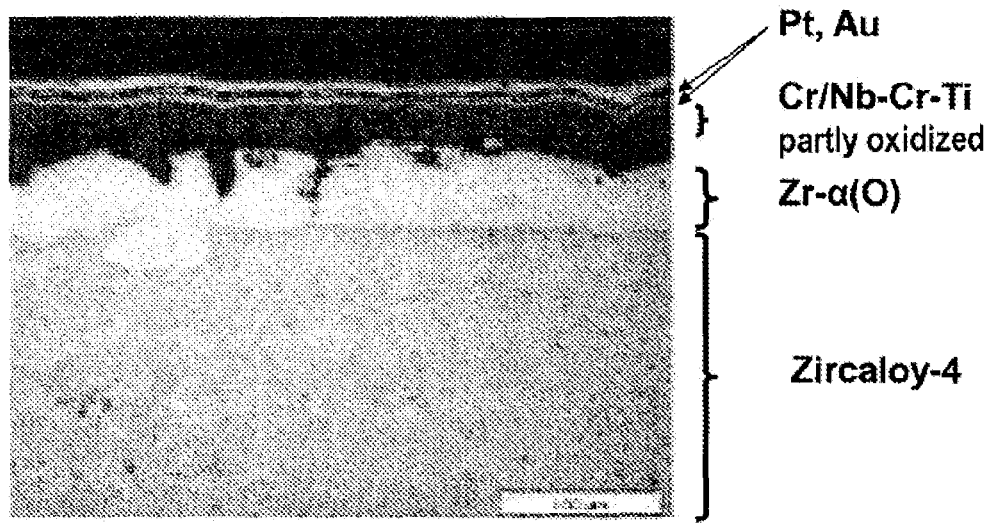
Figure 11:
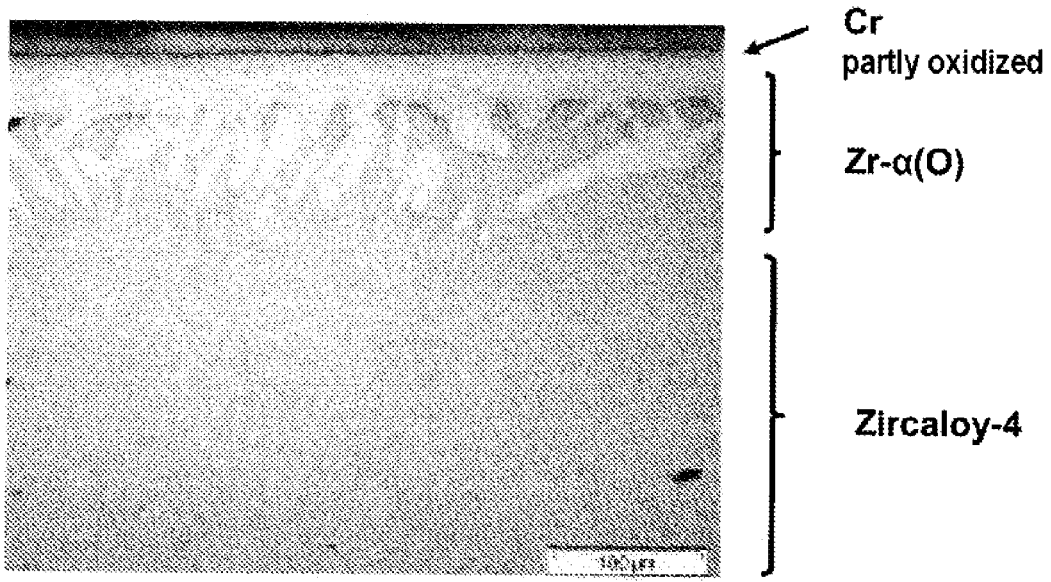
Figure 12:
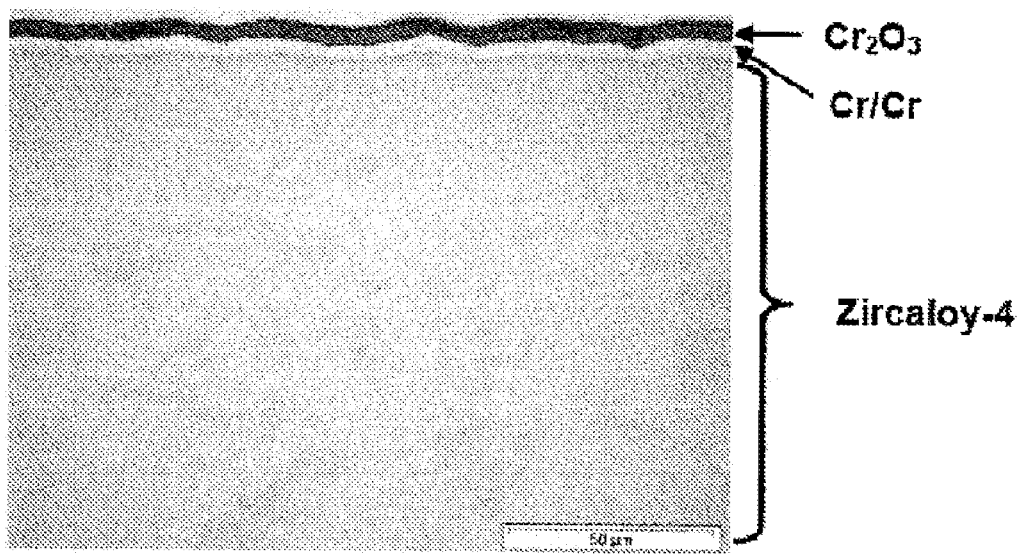

Each figure reveals a microstructure that has the following successive layers:

FIG. 7: outer layer of $ZrO_2$, layer of Zr-α(O), substrate of Zircaloy-4;

FIG. 8: outer layer of platinum and of gold, Cr/Nb—Cr—Ti multilayer coating partly oxidized, dark zone corresponding to detachment during polishing due to the presence of brittle phase, layer of Zr-α(O), substrate of Zircaloy-4;

FIGS. 9 and 10: Cr/Nb—Cr—Ti multilayer coating partly oxidized (with clear outer layer consisting of gold in FIG. 10), layer of Zr-α(O) extending in places in the substrate of Zircaloy-4 in the form of needles of Zr-α(O) with less than 100 μm of projected length, whose presence is delimited in FIG. 9 as an example, substrate of Zircaloy-4;

FIG. 11: coating of chromium partly oxidized, layer of Zr-α(O) extending in places in the substrate of Zircaloy-4 in the form of needles of Zr-α(O) with less than 100 μm of projected length, substrate of Zircaloy-4;

FIG. 12: outer layer of $Cr_2O_3$ resulting from oxidation of the Cr/Cr multilayer coating, sound Cr/Cr multilayer coating, substrate of Zircaloy-4.

The Cr/Nb—Cr—Ti and Cr/Cr multilayer coatings (FIGS. 9, 10 and 12) therefore prevent formation of the brittle oxide $ZrO_2$, whereas this oxide covers the uncoated plate to a thickness of 60 μm (FIG. 7).

The improvement in oxidation resistance of Zircaloy-4 in accident conditions through the use of the Cr/Cr or Cr/Nb—Cr—Ti multilayer coatings is also confirmed by measuring the thickness of the layers of $ZrO_2$ and the equivalent thickness of the layers of Zr-α(O) and by determining the equivalent thickness of oxidized Zircaloy-4, measured on six plates. These measurements are presented in Table 3. They are corroborated by complementary analyses by Casta-ing microprobe (WDS assays) of the concentration profiles on the section of the oxidized plates.

In this table, the equivalent thickness of Zr-α(O) corresponds to the thickness of the layer of Zr-α(O), plus the thickness of a layer whose area is equivalent to the area of the Zr-α (O) needles.

The equivalent thickness of oxidized Zircaloy-4 (i.e. of Zircaloy-4 made brittle by penetration of oxygen) is calculated from the following formula:

Equivalent thickness of oxidized Zircaloy-4=Equivalent thickness of Zr-α(O)+Thickness of $ZrO_2/1.56$ The Pilling-Bedworth coefficient, which has a value of 1.56, reflects the density change on oxidation of zirconium to $ZrO_2$.

It can be seen from Table 3 that the Cr/Cr multilayer coating displays good hermeticity, since although there is some penetration of oxygen into Zircaloy-4, this penetration is not significant enough for Zr-α(O) to appear.

TABLE 3

| | Thickness of the phases (μm) | | |
|---|---|---|---|
| | $ZrO_2$ | Zr-α(O) (equivalent thickness)/ etch on needles | Oxidized Zircaloy-4 (equivalent thickness) |
| Zircaloy-4 without coating | 60 | 62/NO | 101 |
| Zircaloy-4 with Nb—Cr—Ti monolayer coating | 25 | 80/NO | 96 |
| Zircaloy-4 with Cr/Nb—Cr—Ti multilayer coating (M600) | 0 | 8/YES | 8 |
| Zircaloy-4 with Cr/Nb—Cr—Ti multilayer coating (M1000) | 4.90 | 51/YES | 54.70 |
| Zircaloy-4 with Cr monolayer coating | 53 | 57/YES | 92 |
| Zircaloy-4 with Cr/Cr multilayer coating | 0 | 0/NO | 0 |

Even though finer observation of the microstructure shows that the Cr/Nb—Cr—Ti (M600) and Cr/Cr coatings respectively have, for about 2 μm, a partly oxidized layer (a layer of mixed oxide of chromium and niobium, and a layer of chromium oxide, respectively), these oxidized layers have a protective and sacrificial role with respect to oxidation of the underlying Zircaloy-4.

3.3. Measurement of the Oxygen Content

Using WDS assay on polished section, the content by weight of oxygen in the Zr-ex-β layer obtained after quenching is also measured at the core of the plates over a distance of 400 μm.

The measurements presented in Table 4 show that the oxygen content of the zirconium alloy is lowered significantly owing to the presence of the multilayer coatings.

TABLE 4

| | Oxygen content in the ex-β phase (wt %) |
|---|---|
| Zircaloy-4 without coating | 0.40 ± 0.07 |
| Zircaloy-4 with Cr/Nb—Cr—Ti multilayer coating | 0.23 ± 0.03 |
| Zircaloy-4 with Cr/Cr multilayer coating | 0.16 ± 0.03 |

This is particularly advantageous because when this oxygen content is above 0.4 wt %, the ex-β phase has the drawback of adopting brittle behavior at 20° C.

Combined with a dramatic decrease in thickness of the layers of $ZrO_2$ and Zr-α(O), the materials with Cr/Nb—Cr—Ti and particularly Cr/Cr multilayer coatings are therefore able to ensure ductility at the core of zirconium-based nuclear fuel cladding. Such a property is decisive with respect to behavior on quenching and after quenching of the cladding in order to satisfy the safety criteria connected with LOCA.

3.4. Influence of the Multilayer Character

The data in Tables 2, 3 and 4 clearly reveal a very significant improvement in the resistance of the substrate of Zircaloy-4 to oxidation in accident conditions through the use of a multilayer coating instead of a monolayer coating of equivalent composition.

This improvement is also illustrated by comparing the microstructure:
of the substrates of Zircaloy-4 with Nb—Cr—Ti monolayer coating (FIG. 8) or Cr/Nb—Cr—Ti multilayer coating (reference M600: FIG. 9, and to a lesser extent reference M1000: FIG. 10),
of the substrates of Zircaloy-4 with Cr monolayer coating (FIG. 11) or Cr/Cr multilayer coating (FIG. 12) for which the oxidation resistance of the substrate appears total.

4. INFLUENCE OF THE COMPOSITION IN NOMINAL CONDITIONS AND IN ACCIDENT CONDITIONS

To determine the influence of the composition of the multilayer coating of the invention, a plate is prepared consisting of a substrate of Zircaloy-4 provided with a TiN/AlTiN multilayer coating based on titanium nitride and mixed nitride of aluminum and titanium. The TiN/AlTiN multilayer coating with a total thickness of 3.4 μm consists of a sublayer of TiN with a thickness of 200 nm, which is superposed with more than 400 alternating layers of AlTiN or TiN with a thickness of about 7 nm, having a cumulative thickness of 3 μm, then a final layer of AlTiN with a thickness of 200 nm.

This multilayer coating is tested in nominal conditions and in accident conditions according to the protocols of examples 2 and 3. The oxidation resistance of the substrate of zirconium alloy is improved by the TiN/AlTiN coating in nominal conditions, but no improvement is found in accident conditions.

The weight increase of about 10 mg/cm$^2$ after 800 seconds and 18 mg/cm$^2$ after 3000 seconds, as well as the thickness of the oxides formed, are in fact comparable to the plate of Zircaloy-4 without coating.

The various measurements in example 3 show that it is indeed the combination of the structure and composition of the multilayer material of the invention that makes it possible to improve the oxidation resistance in accident conditions.

5. MEASUREMENT OF CORROSION IN ACCIDENT CONDITIONS UNDER STEAM (T=1100° C.) AFTER PRIOR OXIDATION IN NOMINAL CONDITIONS (T=360° C.) AND MICROSTRUCTURE

A hypothetical accident scenario of the LOCA type may occur at any stage in the life of the nuclear fuel cladding in service, therefore after some low-temperature oxidation.

The following measurements are intended to evaluate the effect of prior oxidation in nominal conditions on the efficacy of the Cr/Nb—Cr—Ti multilayer coating, Cr monolayer coating and Cr/Cr multilayer coating with respect to protection against oxidation in accident conditions.

For this purpose, the following plates are submitted to the protocol of oxidation and measurement, successively, according to example 2 (nominal conditions) and then according to example 3 (accident conditions):

a plate of Zircaloy-4 without coating;
a plate of Zircaloy-4 with Cr monolayer coating;
a plate of Zircaloy-4 with Cr/Cr multilayer coating;
a plate of Zircaloy-4 with Cr/Nb—Cr—Ti multilayer coating (Reference M600).

5.1. Structure and Measurement of the Thickness of the Oxidized Layers

The micrographs obtained by optical microscopy on polished section are reproduced in FIGS. 13 to 18. They show that the presence of a layer of pre-oxide (ZrO$_2$ or Cr$_2$O$_3$) formed in nominal conditions on the surface of the plates only has a slight influence on subsequent oxidation in accident conditions.

Figure 13:
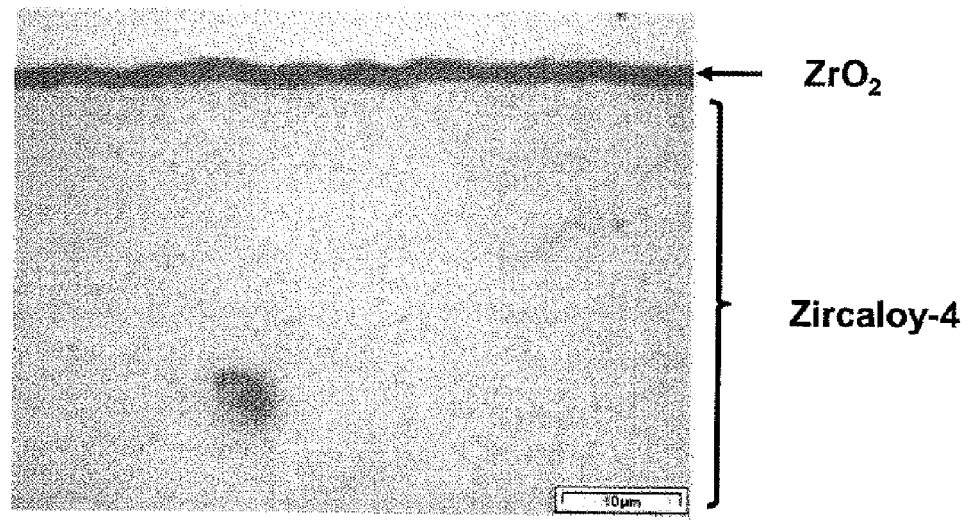
Figure 14:
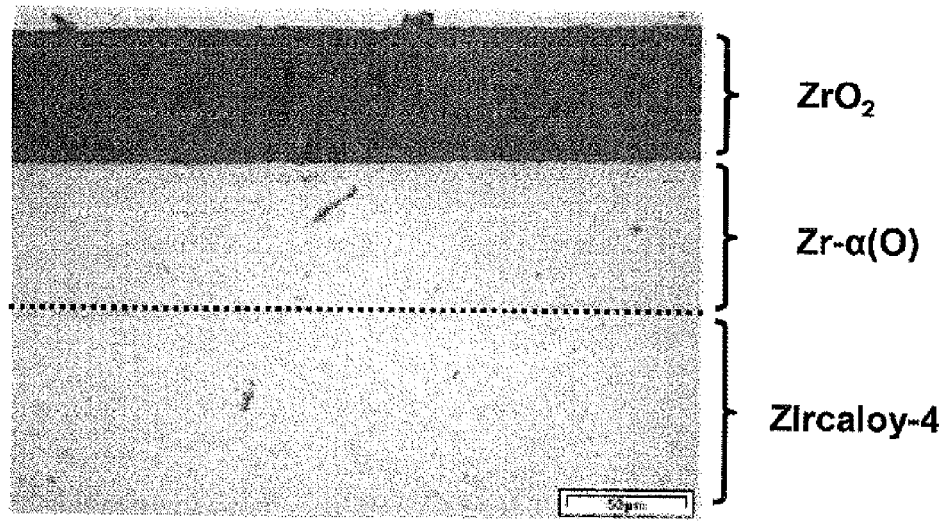
Figure 15:
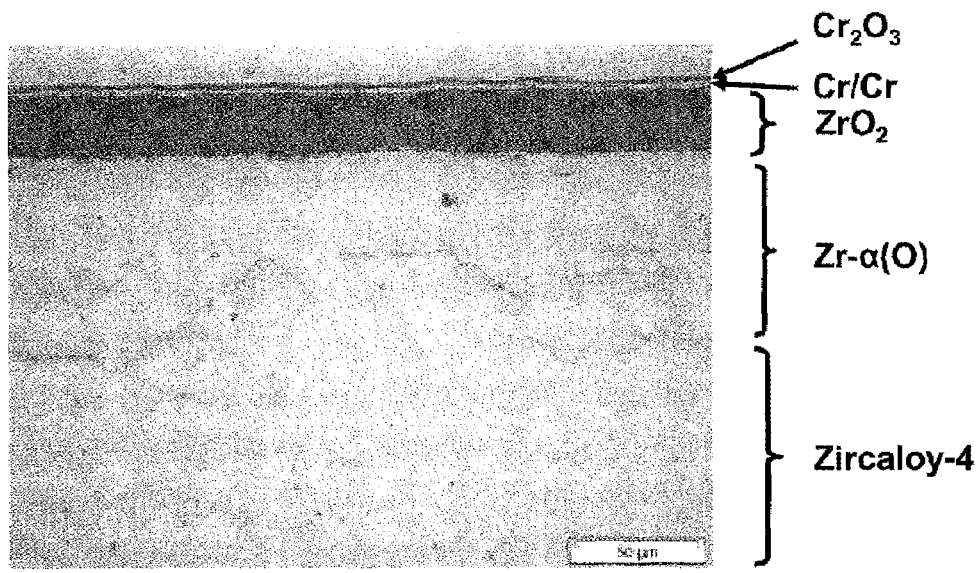

As before, a layer of ZrO$_2$ forms in nominal conditions on the surface of the plate of Zircaloy-4 without coating (FIG. 13). This layer of oxide then becomes thicker notably in accident conditions and is accompanied by formation of an underlying layer of Zr-α(O) with a thickness of 62 μm (FIG. 14). This behavior is similar to that of oxidation in accident conditions only.

For the plate of Zircaloy-4 with Cr monolayer coating, a layer of Cr$_2$O$_3$ forms at the surface in nominal conditions (not shown). In accident conditions (FIG. 15), the layer of Cr$_2$O$_3$ becomes thicker (dark gray layer of 1.5 μm), the unoxidized layer of Cr is still present (white layer of 2 μm) but is no longer protective, which leads to oxidation of the substrate in the form of a layer of ZrO$_2$ of about twenty microns and an underlying layer of Zr-α(O) of about sixty microns.

Regarding the plate of Zircaloy-4 with Cr/Cr multilayer coating, a layer of Cr$_2$O$_3$ forms at the surface in nominal conditions (FIG. 16). Opposite a crack in the coating (rare defect), islands of ZrO$_2$ may form, with thickness comparable to the material without coating. In accident conditions, the layer of Cr$_2$O$_3$ then becomes thicker while continuing advantageously to perform a sacrificial protective role, since the underlying Cr/Cr multilayer coating still keeps a significant thickness (FIG. 17) and prevents oxidation of the inner layer of Zircaloy-4. It should be noted that the behavior of the Cr/Nb—Cr—Ti multilayer coating (micrograph not reproduced) is similar to that of the Cr/Cr multilayer coating.

The only signs of oxidation are those located opposite the few rare cracks present in the initial Cr/Cr multilayer coating: a small island of ZrO$_2$, formed in nominal conditions and marked in FIG. 16, gives rise in accident conditions to islands of ZrO$_2$ and of Zr-α(O), which are delimited with dotted lines in FIG. 18. This demonstrates the major role played by the multilayer coating in the oxidation resistance of Zircaloy-4.

Table 5 shows, for the various plates, the equivalent thicknesses of Zircaloy-4 oxidized in accident conditions without (example 3) or with prior oxidation in nominal conditions (example 4).

The microstructural observations and Table 5 confirm that prior oxidation in nominal conditions does not affect the subsequent efficacy of the Cr/Nb—Cr—Ti and Cr/Cr multilayer coatings with respect to protection against oxidation of the substrate of Zircaloy-4 in accident conditions.

TABLE 5

|  | Equivalent thickness of oxidized Zircaloy-4 (μm) | |
| --- | --- | --- |
|  | Oxidation 850 s at 1100° C. | Oxidation 60 days at 360° C. + 850 s at 1100° C. |
| Zircaloy-4 without coating | 101 | 99 |
| Zircaloy-4 with Cr/Cr multilayer coating | 0.2 | 8 |

The oxidation found for the multilayer material with Cr/Cr coating is in particular due to the presence of a crack in the coating, which allows diffusion of oxygen and oxidation of the Zircaloy-4 opposite this crack, as is illustrated in FIGS. 16 and 18.

5.2. Influence of the Multilayer Character

The data in Table 5, as well as comparison of the microstructure of the substrate of Zircaloy-4 with Cr monolayer coating (FIG. 15) or with Cr/Cr multilayer coating (FIG. 17), confirm that the multilayer coating makes it possible to improve the resistance of the substrate to oxidation in nominal conditions and then in accident conditions, relative to the monolayer coating of equivalent composition.

6. MECHANICAL PROPERTIES AFTER OXIDATION AT 1100° C.

The residual ductility of nuclear fuel cladding submitted to accident conditions, or during and after quenching following the accident, is essentially provided by the thickness of the residual layer of Zr-ex-β, provided that the oxygen content of this layer remains below the maximum content of 0.4 wt % at 20° C.

In order to evaluate their residual ductility, test specimens with dimensions of 25 mm to 45 mm×3 mm×1 mm of Zircaloy-4 without coating and with Cr/Nb—Cr—Ti multilayer coating (reference M600) and Cr/Cr multilayer coating are taken from plates that have undergone oxidation in accident conditions according to example 3. Their mechanical strength is then tested in three-point bending at room temperature.

The stress/strain curves obtained are reproduced in FIG. 19.

They show that, beyond the elastic region, the test specimen of Zircaloy-4 without coating displays some strain. Instabilities caused by successive cracking of $ZrO_2$ and Zr-α(O) gradually lead to destruction of the material, but make it possible to accommodate the deformation of the underlying residual ductile Zircaloy-4 and avoid complete fracture of the test specimen.

Regarding the test specimens of Zircaloy-4 with multilayer coatings, they display deformation without fracture that is at least as great, while avoiding the phenomena of surface spalling of brittle phase. The test specimen of Zircaloy-4 with Cr/Cr multilayer coating in particular has notably improved mechanical strength, since it has a deflection of 5 to 6 mm for a stress that may reach 42 MPa to 47 MPa.

This improvement in mechanical strength may prove decisive for the good mechanical behavior of nuclear fuel cladding before and after quenching.

7. MEASUREMENT OF CORROSION AND HYDROGEN UPTAKE IN ACCIDENT CONDITIONS AFTER 15 000 SECONDS UNDER STEAM (T=1000° C.)

7.1. Measurement of Corrosion

The plates with substrate of Zircaloy-4 without coating and with Cr/Cr multilayer coating are oxidized at 1000° C. for 15000 seconds.

The temperature of 1000° C. is within a range that leads to instability of the layer of $ZrO_2$ that may be formed on the surface.

Figure 22:
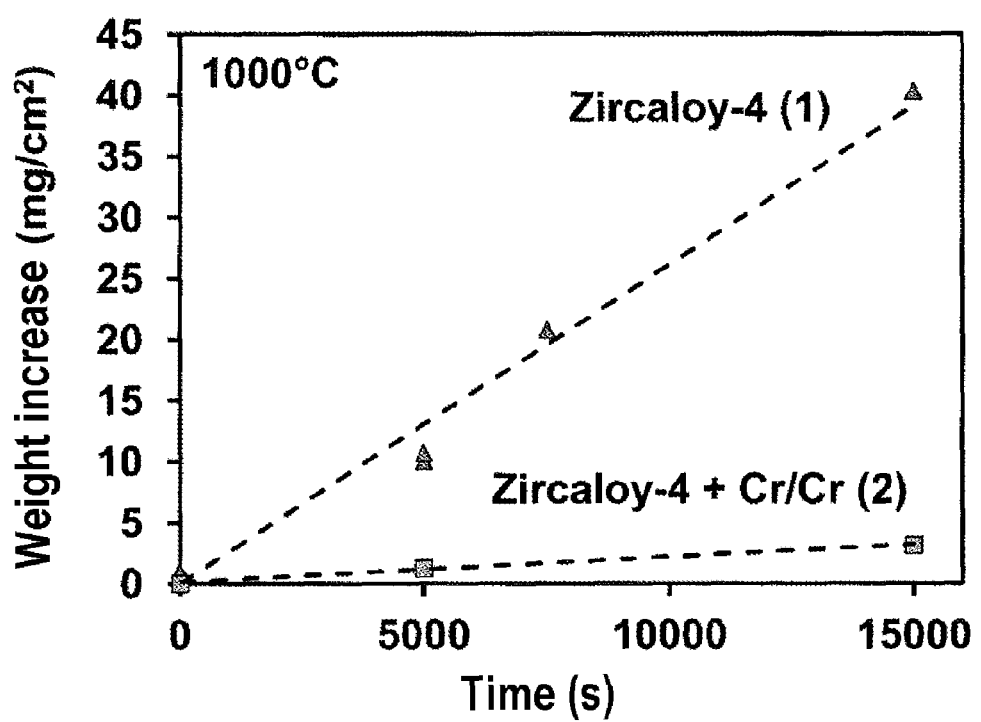

The variation over time of the weight increase of the plates is illustrated in FIGS. 20 and 21, as well as in Table 6, to which the graph in FIG. 22 corresponds.

TABLE 6

| | Weight increase (mg/cm²) | |
|---|---|---|
| Oxidation time (seconds) | Zircaloy-4 without coating | Zircaloy-4 with Cr/Cr multilayer coating |
| 0 | 0 | 0 |
| 5000 | 10.05 | 1.32 |
| 5000 | 10.68 | 1.22 |
| 7500 | 20.75 | — |
| 15000 | 40.3 | 3.14 |

Each figure reveals a microstructure that has the following successive layers:

FIG. 20: outer layer of $ZrO_2$, layer of Zr-α(O), substrate of Zircaloy-4;

FIG. 21: outer layer of gold, layer of $Cr_2O_3$, Cr/Cr multilayer coating, layer of Zr-α(O), substrate of Zircaloy-4.

These data reveal that the weight increase resulting from the formation of oxide is still greatly limited by the Cr/Cr multilayer coating, even after 15 000 seconds of oxidation in accident conditions.

This behavior is confirmed by the microstructural observations, which show a smaller thickness of the layer of Zr-α(O) for the substrate of Zircaloy-4 with Cr/Cr multilayer coating (FIG. 21), relative to that without coating (FIG. 20) which moreover shows partial stripping of the layer of Zr-α(O) during polishing due to the presence of brittle phase and formation of a layer of $ZrO_2$.

Moreover, after 15 000 seconds of oxidation, the images of the surface of the plates (not reproduced here) show that only the surface of the plate without coating displays marked exfoliation connected with the low mechanical strength of $ZrO_2$. The plate with Cr/Cr multilayer coating, for its part, does not display any spalling.

7.2. Measurement of Hydrogen Uptake

In order to determine their content of dissolved hydrogen, the plates are heated to 600° C. in order to dissolve all the hydrides that have formed.

Using calorimetry, the hydrogen content is then measured by integration of the exothermic peak of precipitation of the hydrides after cooling.

The results are presented in Table 7.

TABLE 7

| | Weight increase after 15000 s | Hydrogen uptake after 15000 s |
|---|---|---|
| Zircaloy-4 without coating | 40.30 mg/cm² | 2000 ppm |
| Zircaloy-4 with Cr/Cr multilayer coating | 3.14 mg/cm² | 200 ppm |

The measured hydrogen content shows the gain supplied by the material with Cr/Cr multilayer coating for the resistance to hydriding during oxidation in accident conditions.

8. CONCLUSIONS

The foregoing examples demonstrate that coating a zirconium-based substrate with a multilayer coating according to the invention comprising metallic layers composed of identical or different substances chosen from chromium, a chromium alloy or a ternary alloy of the Nb—Cr—Ti system offers the following advantages:

in nominal conditions: limiting or even preventing oxidation and/or hydriding of the zirconium-based substrate (among other things, formation of the $ZrO_2$ phase causing embrittlement), especially when some or all of the multilayer coating layers are composed of a niobium alloy;

in accident conditions, with or without prior oxidation in nominal conditions: limiting or preventing formation of Zr-α(O), or completely preventing formation of $ZrO_2$, as both of these oxides may cause embrittlement of the zirconium-based substrate; lowering the concentration of oxygen in the Zr-ex-β layer in order to improve the residual ductility and mechanical strength of the zirconium-based substrate after oxidation; and decreasing the hydrogen uptake, which may also lead to embrittlement of the cladding. It should be noted in particular that the use of a multilayer coating instead of a monolayer coating of identical or similar composition improves the oxidation resistance of the zirconium-based substrate.

It follows from the aforementioned advantages that the use of a multilayer material according to the invention for manufacturing a zirconium-based nuclear fuel cladding has important practical consequences for the behavior of this cladding during and after an accident, for example of the LOCA type:

- slowing of high-temperature oxidation, in order to prevent or at least delay possible runaway of oxidation, which would lead to rapid degradation of the cladding associated with uptake or considerable production of hydrogen;
- improvement in resistance to high-temperature oxidation, giving a significant gain in mechanical properties of the cladding, among others an increase in the residual ductility of the cladding through better behavior during quenching and after quenching. Now, most of the nuclear safety authorities throughout the world have defined a critical degree of oxidation that must not be exceeded in order to meet the margins for ensuring more or less long-term cooling of the core of a nuclear reactor after an accident of the LOCA type. The use of the multilayer material of the invention would enable margins to be gained at the level of the grace periods and critical oxidation temperatures to be observed. This makes it possible to envisage potential simplifications of the safety systems for emergency cooling and/or greater flexibility in the management of nuclear reactors;
- increase in the mechanical strength of nuclear fuel cladding in order to preserve its structure during ballooning and gain safety margins with respect to the problems of the degree of clogging of the inter-rod channels.

Moreover, apart from accident conditions, the multilayer material of the invention also has the advantages that it has little effect on:

- the general mechanical properties of the cladding in service conditions;
- the weight of the fuel rods;
- neutron behavior making it possible to use coatings optionally with little capture;
- use of proved methods of deposition facilitating transfer to industrial application;
- the current and/or future geometry of the nuclear fuel claddings and therefore of the nuclear reactor core. This allows the multilayer material of the invention to be considered for use in the core of various types of nuclear reactors (PWR, BWR, FNR, etc.), for nuclear propulsion, and more generally for any reactor core or nuclear steam generator, whether or not compact, requiring increased resistance to oxidation.

The invention claimed is:

1. Multilayer material comprising a zirconium-based substrate covered with a multilayer coating, said multilayer coating comprising metallic layers composed of substances selected from the group consisting of chromium, a chromium alloy, and a ternary alloy of the Nb—Cr—Ti system, wherein said metallic layers are not all of identical composition.

2. Multilayer material according to claim 1, said multilayer coating consisting of said metallic layers.

3. Multilayer material according to claim 1, wherein said multilayer coating comprises from 2 to 50 metallic layers.

4. Multilayer material according to claim 1, wherein each of said metallic layers has a thickness from 3 nm to 1 μm.

5. Multilayer material according to claim 1, wherein the cumulative thickness of said metallic layers is from 6 nm to 10 μm.

6. Multilayer material according to claim 5, wherein said multilayer coating comprises at least ten metallic layers each of which has a thickness of at least 100 nm, the cumulative thickness of said metallic layers being from 1 μm to 6 μm.

7. Multilayer material according to claim 1, wherein said metallic layers composed of chromium or of a chromium alloy contain at least one chemical element chosen from silicon or yttrium.

8. Multilayer material according to claim 7, wherein silicon or yttrium is present at a content of from 0.1 to 20 at %.

9. Multilayer material according to claim 1, wherein the ternary alloy of the Nb—Cr—Ti system comprises in atomic percentage from 50% to 75% of niobium, from 5% to 15% of chromium and from 20% to 35% of titanium.

10. Multilayer material according to claim 1, wherein said metallic layer or layers composed of a ternary alloy of the Nb—Cr—Ti system have a thickness from 5 nm to 500 nm.

11. Multilayer material according to claim 1, wherein said metallic layers are i) one or more layers composed of chromium and/or a chromium alloy and ii) one or more layers composed of the ternary alloy of the Nb—Cr—Ti system.

12. Multilayer material according to claim 11, wherein a metallic intermediate bonding layer composed of chromium or of chromium alloy is in contact with the zirconium-based substrate.

13. Multilayer material according to claim 1, wherein said metallic layers are independently selected from the group consisting of chromium and a chromium alloy.

14. Multilayer material according to claim 1, wherein said metallic layers are all composed of a ternary alloy of the Nb—Cr—Ti system.

15. Multilayer coating comprising metallic layers, at least one of which is a ternary alloy of the Nb—Cr—Ti system, and wherein said metallic layers are not all of identical composition.

16. Multilayer coating according to claim 15, wherein said metallic layers are i) one or more layers composed of chromium and/or a chromium alloy and ii) one or more layers composed of the ternary alloy of the Nb—Cr—Ti system.

17. Multilayer coating according to claim 15, further comprising an outer bonding layer composed of chromium or of a chromium alloy.

18. Part composed wholly or partly of the multilayer material or of the multilayer coating as defined according to claim 1, said part being a component of a nuclear reactor.

19. Part according to claim 18, said part being a nuclear fuel cladding, a guide tube, a spacer grid or a plate fuel.

20. Method for manufacturing a multilayer material as defined according to claim 1, comprising a plurality of metal deposition steps, as a result of which a zirconium-based substrate is covered with a multilayer coating comprising metallic layers composed of substances independently selected from the group consisting of chromium, a chromium alloy and a ternary alloy of the Nb—Cr—Ti system, wherein one such metallic layer is deposited in each metal deposition step, and wherein said metallic layers are not all of identical composition.

21. Method of manufacture according to claim 20, wherein the substrate is covered by performing sequential deposition.

22. Method of manufacture according to claim 21, wherein the sequential deposition is carried out at a temperature of at most 580° C.

23. Method of manufacture according to claim 21, wherein the substrate is covered by means of an operation of chemical vapor deposition or of pulsed electrolysis.

24. Method of manufacture according to claim 21, wherein the substrate is covered by means of an operation of physical vapor deposition.

25. Method of manufacture according to claim 24, wherein the operation of physical vapor deposition is cathodic sputtering.

26. Method of manufacture according to claim 25, wherein the cathodic sputtering is of the magnetron type.

27. Method of manufacture according to claim 24, wherein physical vapor deposition is carried out at a temperature of from 50° C. to 700° C.

28. Multilayer material obtained or obtainable by the method of manufacture according to claim 20.

29. A multilayer material comprising a zirconium-based substrate covered with a multilayer coating, said multilayer coating comprising a plurality of layers of identical composition, said composition selected from the group consisting of chromium, a chromium alloy, and a ternary alloy of the Nb—Cr—Ti system;

said multilayer coating being differentiable from a monolayer coating of the same total thickness and composition, by virtue of a difference in the property of resistance to oxidation or corrosion of the zirconium-based substrate of the multilayer coating relative to those of the monolayer coating, wherein said monolayer coating and each layer of the multilayer coating are deposited by the same method, except that the duration of the deposition for each such layer of the multilayer is shorter than that for the deposition of the monolayer.

30. Method for manufacturing a multilayer material according to claim 29, said method comprising a plurality of metal deposition steps, as a result of which a zirconium-based substrate is covered with a multilayer coating comprising metallic layers, wherein one such metallic layer is deposited in each metal deposition step, and the layers are of identical composition, said composition being selected from the group consisting of chromium, a chromium alloy and a ternary alloy of the Nb—Cr—Ti system.

31. Multilayer material obtained by the method of manufacture according to claim 30.

* * * * *